(12) United States Patent
Asano

(10) Patent No.: US 10,008,442 B2
(45) Date of Patent: Jun. 26, 2018

(54) THROUGH-ELECTRODE SUBSTRATE, METHOD FOR MANUFACTURING SAME, AND SEMICONDUCTOR DEVICE IN WHICH THROUGH-ELECTRODE SUBSTRATE IS USED

(71) Applicant: DAI NIPPON PRINTING Co., Ltd, Tokyo (JP)

(72) Inventor: Masaaki Asano, Tokyo (JP)

(73) Assignee: DAI NIPPON PRINTING Co., Ltd., Tokyo (JP)

(*) Notice: Subject to any disclaimer, the term of this patent is extended or adjusted under 35 U.S.C. 154(b) by 0 days. days.

(21) Appl. No.: 15/422,990

(22) Filed: Feb. 2, 2017

(65) Prior Publication Data

US 2017/0148719 A1 May 25, 2017

Related U.S. Application Data

(63) Continuation of application No. PCT/JP2015/070636, filed on Jul. 21, 2015.

(30) Foreign Application Priority Data

Aug. 6, 2014 (JP) ................. 2014-160122

(51) Int. Cl.
*H05K 1/11* (2006.01)
*H05K 3/42* (2006.01)
(Continued)

(52) U.S. Cl.
CPC ...... *H01L 23/49838* (2013.01); *H01L 21/486* (2013.01); *H01L 23/49827* (2013.01);
(Continued)

(58) Field of Classification Search
CPC .......... H05K 1/115; H05K 1/116; H05K 3/42; H05K 3/421; H05K 3/423; H05K 3/424
See application file for complete search history.

(56) References Cited

U.S. PATENT DOCUMENTS

2012/0306084 A1 12/2012 Wood et al.
2012/0327626 A1 12/2012 Horiuchi et al.

FOREIGN PATENT DOCUMENTS

JP H04-93096 A 3/1992
JP 2005-38942 A 2/2005
(Continued)

OTHER PUBLICATIONS

Partial translation of the Written Opinion dated Oct. 6, 2015 for PCT application No. PCT/JP2015/070636 which has been filed on Feb. 2, 2017.
(Continued)

*Primary Examiner* — Jeremy C Norris
(74) *Attorney, Agent, or Firm* — TYPHA IP LLC

(57) ABSTRACT

A through-electrode substrate includes a base including a first surface and a second surface mutually opposing each other, and a through-electrode arranged in a through-hole passing through the second surface from the first surface of the base, wherein the through-electrode includes an first end surface of the first surface side and an second end surface of the second surface side exposed from the base in the first surface and the second surface, and a periphery edge of one or both of the first end surface of the first surface side and the second end surface of the second surface side is covered by a part of the base.

11 Claims, 28 Drawing Sheets

(51) Int. Cl.
*H01L 23/498* (2006.01)
*H01L 21/48* (2006.01)
*H01L 25/065* (2006.01)
*H01L 23/00* (2006.01)

(52) U.S. Cl.
CPC ........ *H01L 23/49894* (2013.01); *H05K 1/115* (2013.01); *H05K 3/42* (2013.01); *H01L 24/17* (2013.01); *H01L 24/48* (2013.01); *H01L 24/73* (2013.01); *H01L 25/0652* (2013.01); *H01L 25/0657* (2013.01); *H01L 2224/13109* (2013.01); *H01L 2224/13144* (2013.01); *H01L 2224/13147* (2013.01); *H01L 2224/16145* (2013.01); *H01L 2224/16227* (2013.01); *H01L 2224/48091* (2013.01); *H01L 2224/48106* (2013.01); *H01L 2224/48227* (2013.01); *H01L 2224/73257* (2013.01); *H01L 2225/0651* (2013.01); *H01L 2225/06513* (2013.01); *H01L 2225/06517* (2013.01); *H01L 2225/06548* (2013.01); *H01L 2924/15747* (2013.01)

(56) References Cited

FOREIGN PATENT DOCUMENTS

| | | |
|---|---|---|
| JP | 2007-184314 A | 7/2007 |
| JP | 2008-066601 A | 3/2008 |
| JP | 2011-228495 A | 11/2011 |
| JP | 2013-33894 A | 2/2013 |
| JP | 2014-517534 A | 7/2014 |
| WO | 2012/108381 A1 | 8/2012 |

OTHER PUBLICATIONS

Japanese Office Action dated May 17, 2016 for the corresponding Japanese application No. 2014-160122, with Partial English translation.
International Search Report for the PCT application No. PCT/JP2015/070636, with Partial English translation.
Written Opinion for the PCT application No. PCT/JP2015/070636.
Japanese Office Action dated Apr. 10, 2018 for corresponding Japanese Application No. 2016-163981 with partial translation.

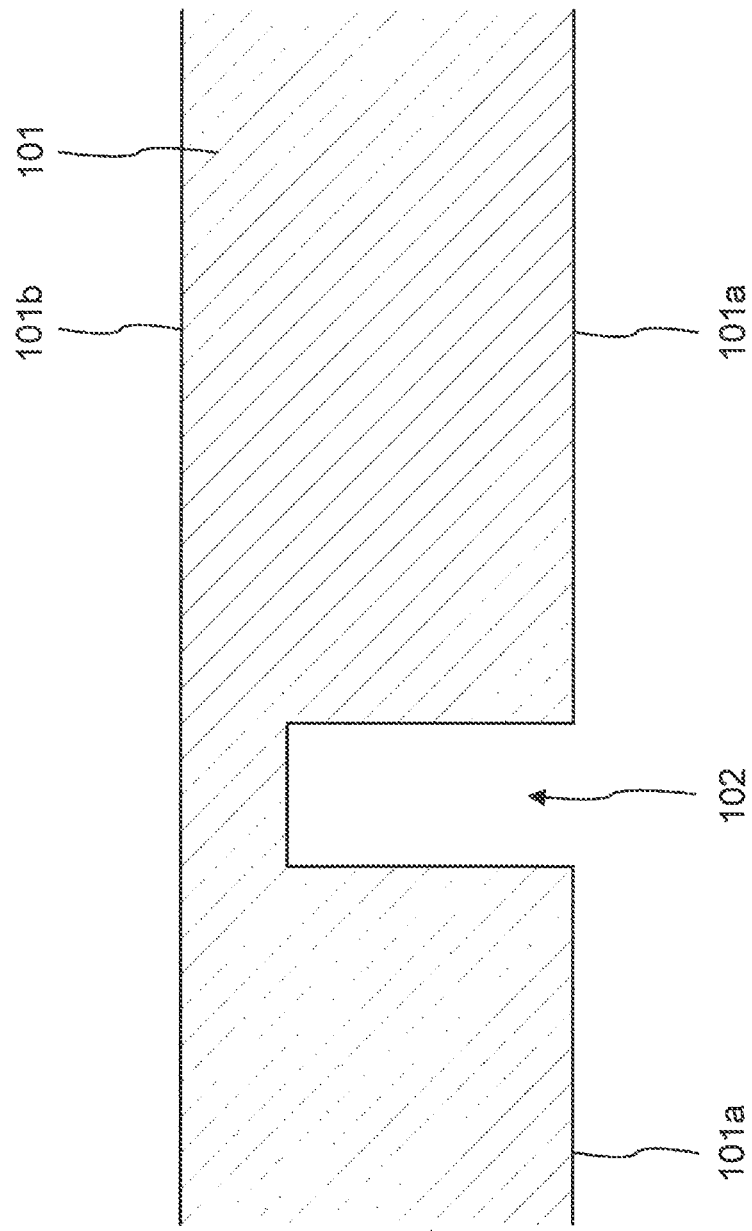

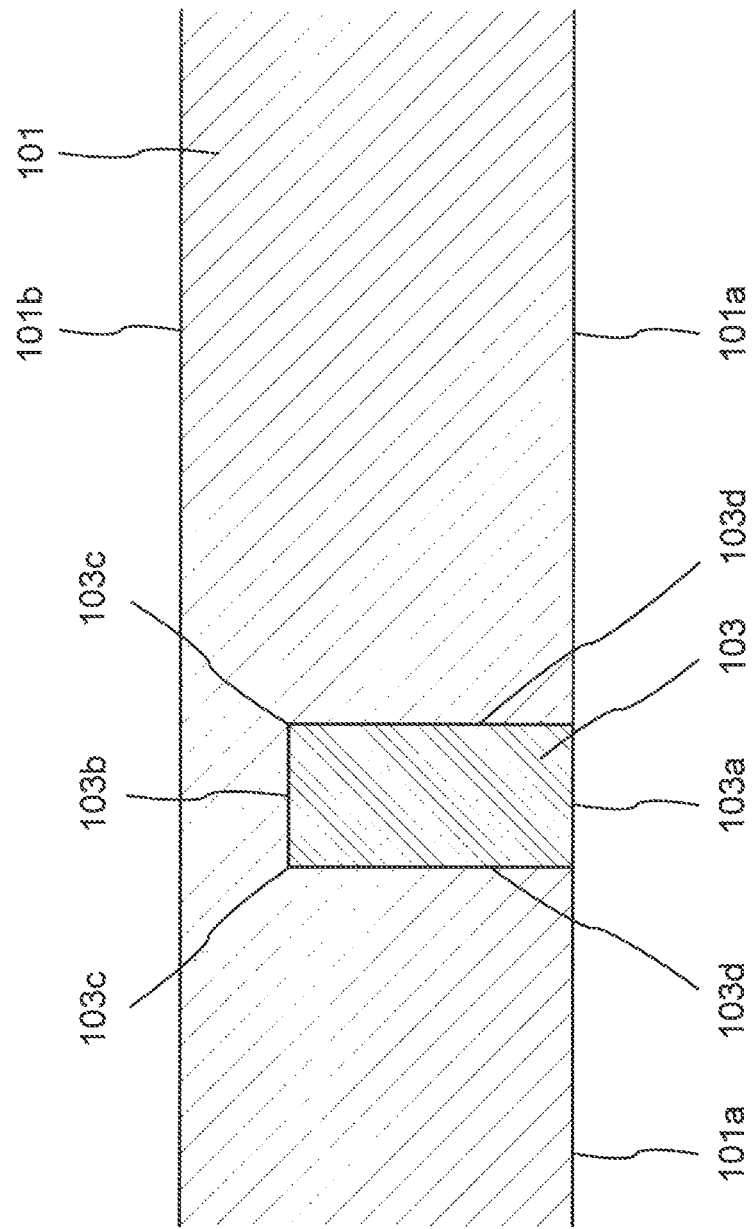

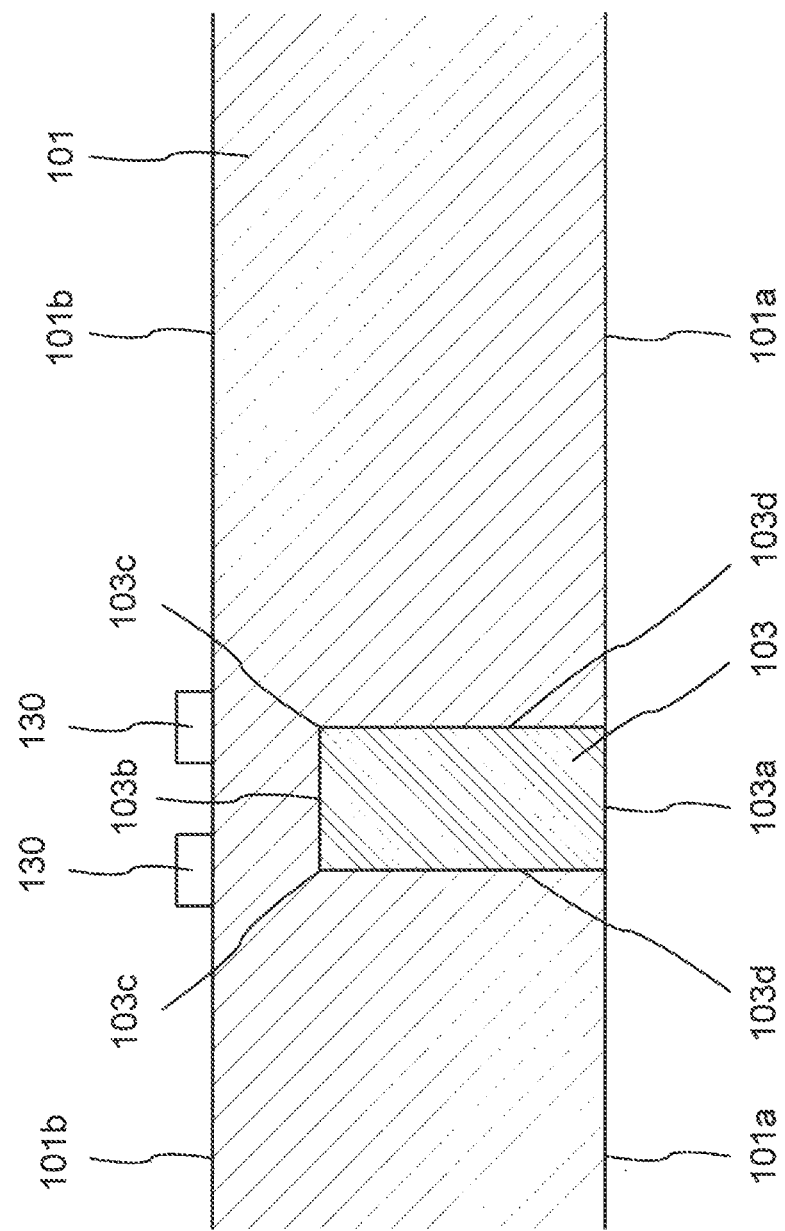

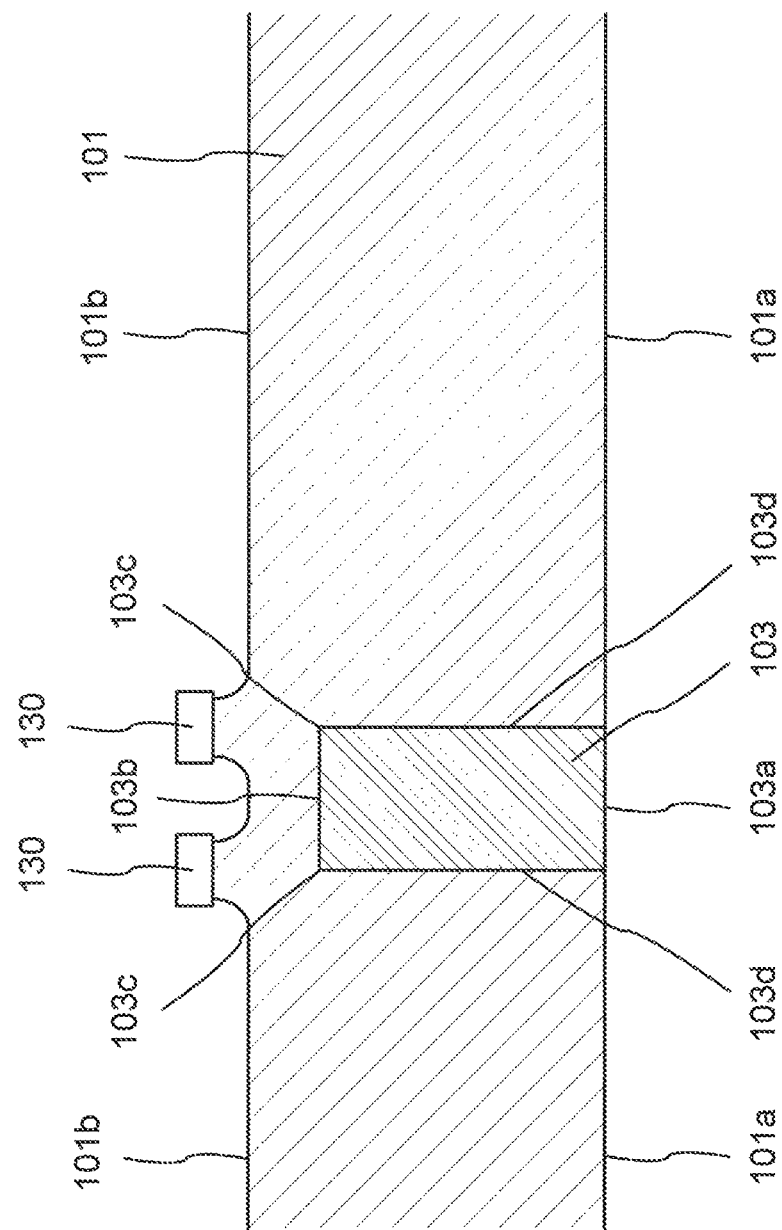

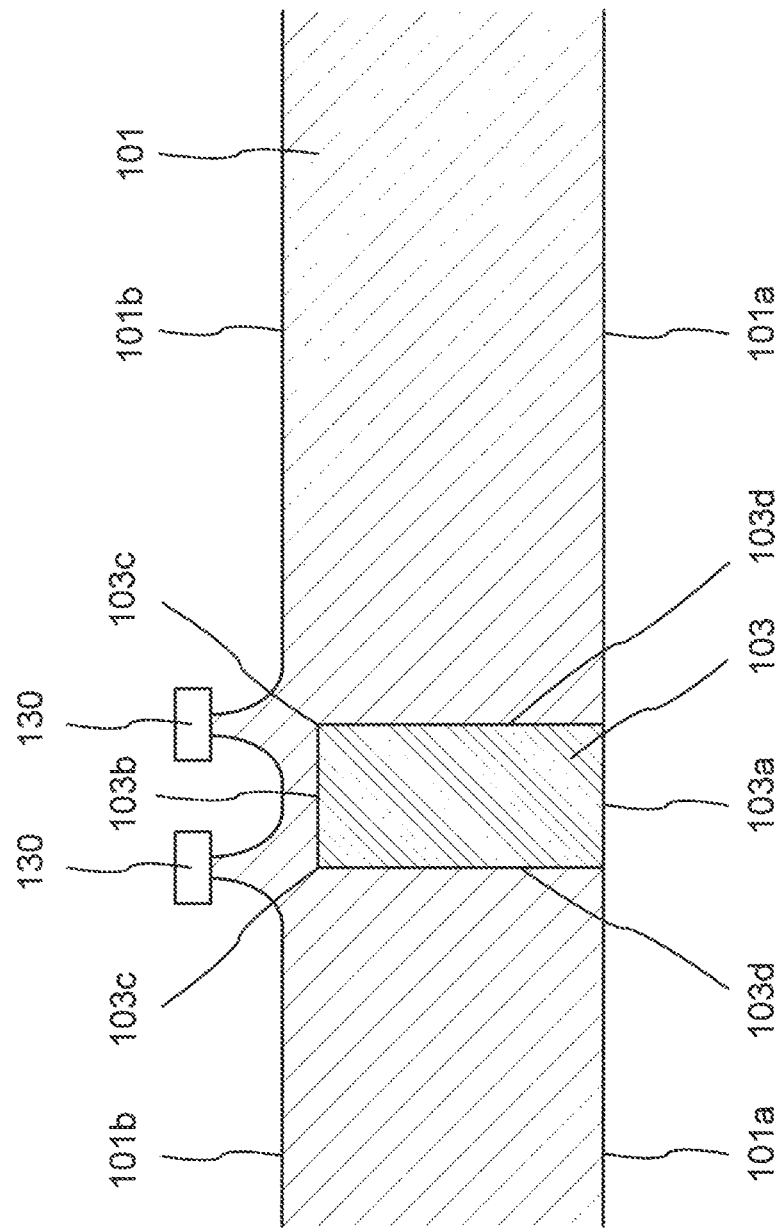

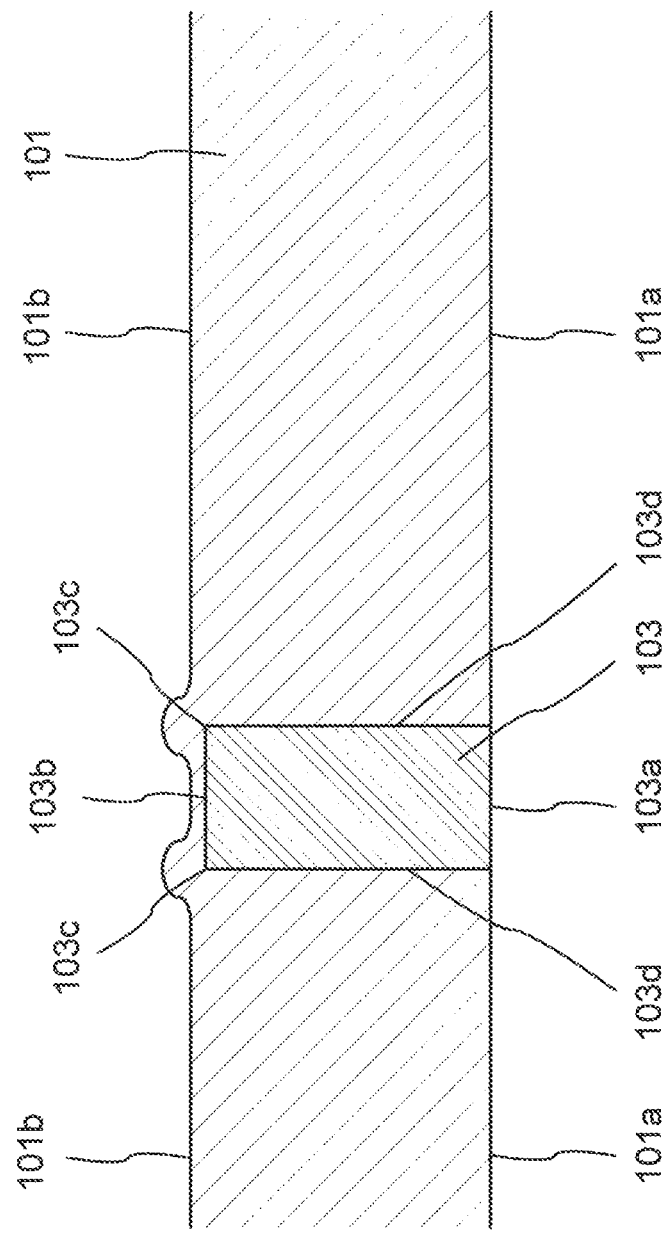

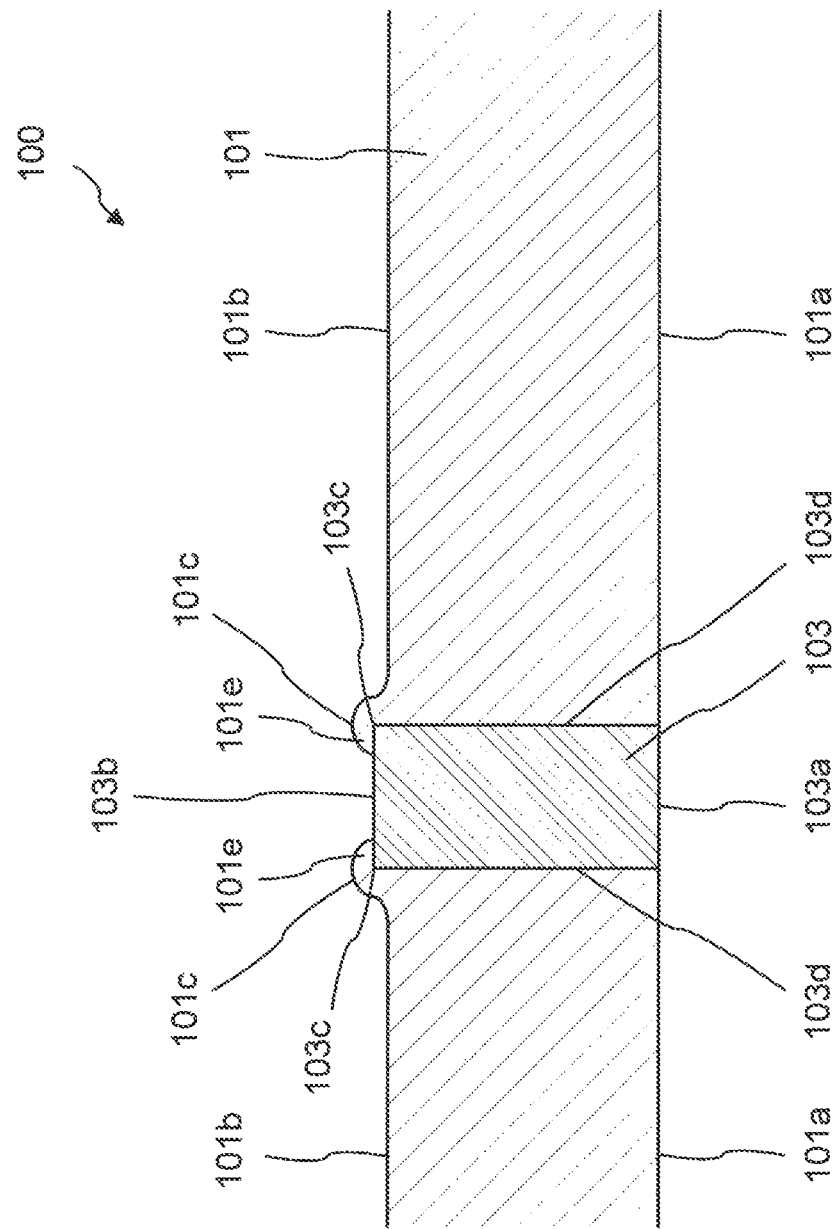

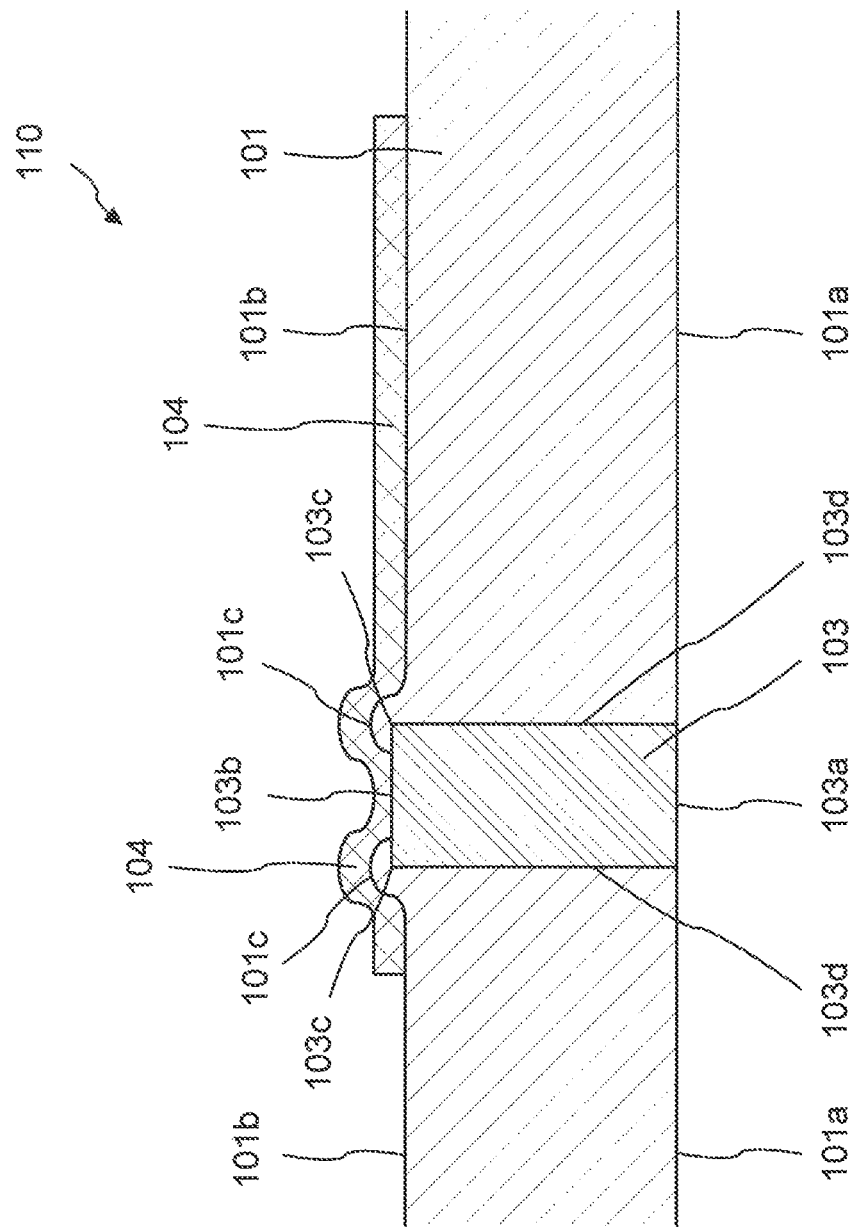

THROUGH-ELECTRODE SUBSTRATE, METHOD FOR MANUFACTURING SAME, AND SEMICONDUCTOR DEVICE IN WHICH THROUGH-ELECTRODE SUBSTRATE IS USED

CROSS REFERENCE TO RELATED APPLICATIONS

This application is based upon and claims the benefit of priority from the prior Japanese Patent Application No. 2014-160122 filed on Aug. 6, 2014, and PCT Application No. PCT/JP2015/070636 filed on Jul. 21, 2015, the entire contents of which are incorporated herein by reference.

FIELD

The embodiments of the present disclosure are related to a through-electrode substrate, a manufacturing method of the through-electrode substrate, and a semiconductor device using the through-electrode substrate.

BACKGROUND

In recent years, the development of a through-electrode substrate arranged with a conducting part which conducts the front and rear surfaces of a substrate as an interposer between LSI chips is progressing. A through-electrode is formed in such a through-electrode substrate by filling a conductive material into a through-hole by electrolytic plating. As a conventional technology of a through-electrode substrate, a through-electrode substrate manufactured using a SOI wafer for example is disclosed (see Japanese Laid Open Patent Publication No. 2005-38942). This through-electrode substrate is arranged with a blind via hole having a depth which reaches a buried insulation layer in a support substrate layer of a SOI wafer, and a through-electrode is arranged by forming an inner wall insulation layer on an inner wall of the blind via hole. In addition, a contact hole is arranged in a section corresponding to a through-electrode in a buried insulation layer exposed by removal of a silicon layer.

SUMMARY

According to one embodiment of the present disclosure, a through-electrode substrate is provided including a base including a first surface and a second surface opposing the first surface and a through-electrode arranged in a through-hole passing through the first surface and second surface of the base, wherein the through-electrode includes an end surface of the first surface side and an end surface of the second surface side exposed from the substrate in the first surface and the second surface, and a periphery edge of one or both of the end surface of the first surface side and the end surface of the second surface side of the through-electrode is covered by a part of the base.

In addition, the base may be positioned in the periphery edge or in an outer side of the periphery edge of the through-electrode, and may include a ring shaped convex part along the periphery edge.

In addition, the base may include glass.

In addition, the base may include silicon and an insulation film may be arranged in an inner wall surface of the through-electrode.

In addition, a component having the same material as the base may be arranged on an inner side of one or both of the end surface of the first surface side and the end surface of the second surface side having the periphery edge covered by a part of the base.

In addition, a plurality of wires may be arranged on one or both of the end surface of the first surface side and the end surface of the second surface side having the periphery edge covered by a part of the base.

In addition, according to another embodiment of the present disclosure, a method of manufacturing a through-electrode substrate is provided including forming an aperture part in a first surface of a base, the base including a first surface and a second surface mutually opposing each other, at a depth not reaching the second surface, forming an electrode by filling the aperture part with a conductive material, providing a mask on the second surface of the base, having an aperture in a part corresponding to an inner side region of the electrode and covering a periphery edge of the electrode, and etching the second surface of the base in a state arranged with the mask, exposing a part of the inner side region of the electrode, and leaving a part of the base at the periphery edge of the electrode.

In addition, the mask may be formed in a ring shape.

In addition, at least a part of the etching may include isotropic etching.

In addition, the mask may be removed as the etching proceeds.

In addition, according to another embodiment of the present disclosure, a semiconductor device is provided including the through-electrode substrate described above.

According to the embodiments of the present disclosure, since a through-electrode passing through two mutually opposing surfaces is arranged in a base and at least a periphery edge of one surface of the through-electrode is covered by the base, it is possible to provide a structurally stable through-electrode substrate.

BRIEF DESCRIPTION OF DRAWINGS

FIG. 1 is a schematic diagram showing a cross-section of a substrate arranged with a bottomed hole in a manufacturing method of a through-electrode substrate related to a first embodiment of the present disclosure;

FIG. 2 is a schematic diagram showing a cross-section of a substrate arranged with a through-electrode in a manufacturing method of a through-electrode substrate related to the first embodiment of the present disclosure;

FIG. 3 is a schematic diagram showing a cross-section of a substrate arranged with a mask in a manufacturing method of a through-electrode substrate related to the first embodiment of the present disclosure;

FIG. 4 is a schematic diagram showing a cross-section of a substrate during etching in a manufacturing method of a through-electrode substrate related to the first embodiment of the present disclosure;

FIG. 5 is a schematic diagram showing a cross-section of a substrate during etching in a manufacturing method of a through-electrode substrate related to the first embodiment of the present disclosure;

FIG. 6 is a schematic diagram showing a cross-section of a substrate during etching in a manufacturing method of a through-electrode substrate related to the first embodiment of the present disclosure;

FIG. 7 is a schematic diagram showing a cross-section of a substrate after etching is completed in a manufacturing method of a through-electrode substrate related to the first embodiment of the present disclosure;

FIG. 9 is a schematic diagram showing a cross-section of a substrate arranged with a wiring layer in a manufacturing method of a through-electrode substrate related to the first embodiment of the present disclosure;

DESCRIPTION OF EMBODIMENTS

Figure 25:
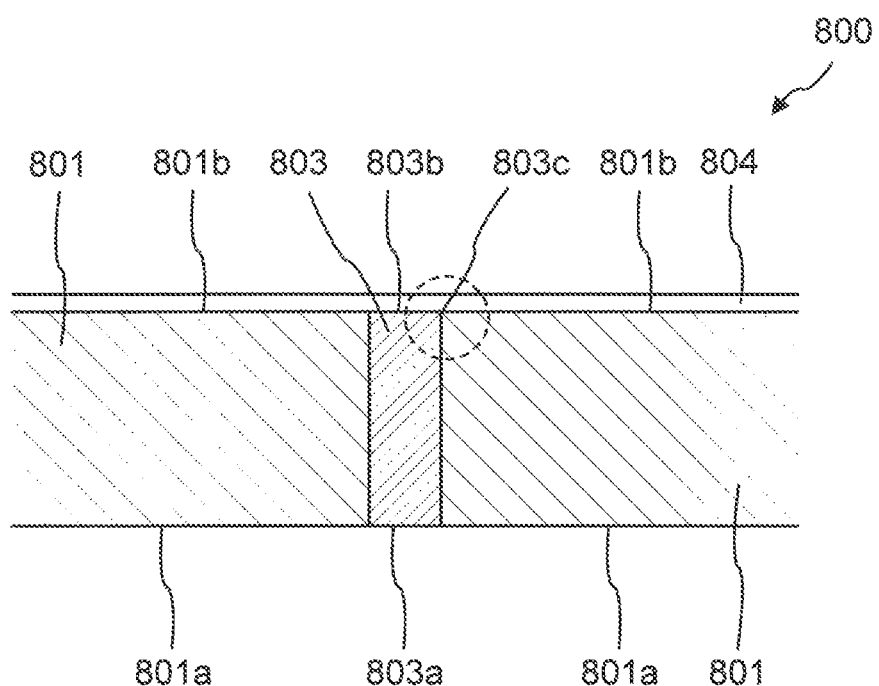
FIG. 25 is a schematic diagram showing a cross-section of a through-electrode substrate.
Figure 26:
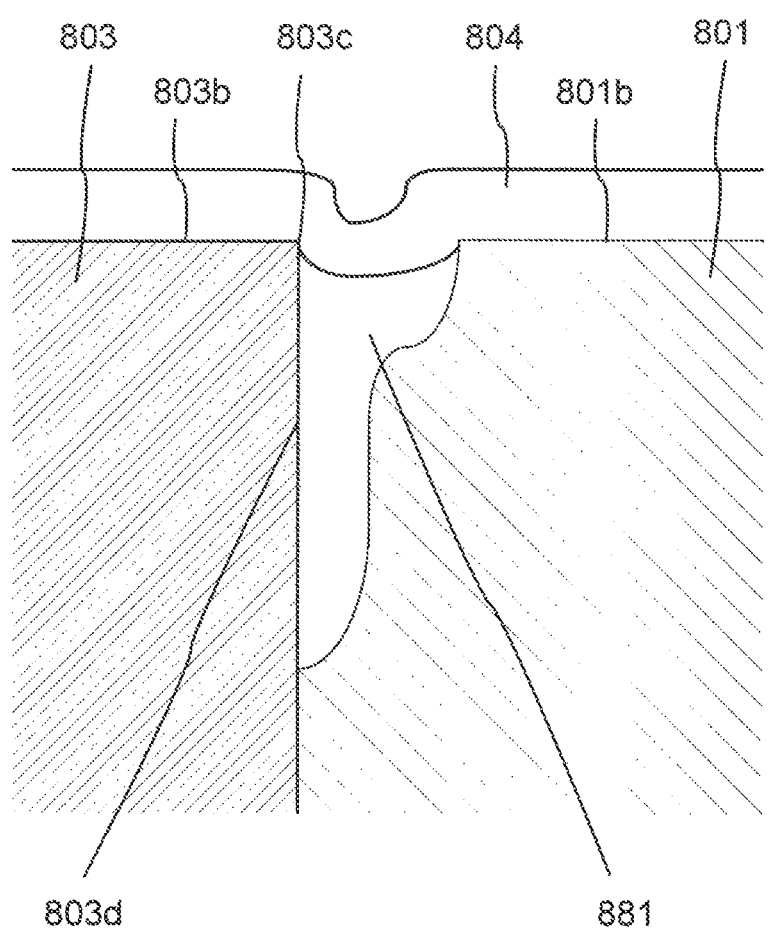
FIG. 26 is a schematic diagram showing a cross-section of a through-electrode substrate.

The through-electrode substrate described in Japanese Laid Open Patent 2005-38942 includes a structure whereby an insulation layer is arranged on a surface and conduction is obtained by a through-electrode being exposed by a contact hole arranged in the insulation layer. FIG. 25 and FIG. 26 show a structure of such a through-electrode substrate 800 using a cross-sectional view. A base 801 includes mutually opposing surfaces 801a and 801b, and a through-electrode 803 is arranged in a through-hole which passes through the surfaces 801a and 801b. Here, it can be seen that the surface 801b of the base 801 and a surface 803b of the through-electrode 803 form the same surface. Wiring 804 is arranged above the surface 801b of the base 801 and the surface 803b of the through-electrode 803.

FIG. 26 is an expanded view of the vicinity of the through-electrode substrate 800 shown in FIG. 25 enclosed by the dotted line and shows the vicinity of a periphery edge 803c on the surface 803b side of the through electrode 803. Although the through-electrode 803 is formed filled by electrolytic plating in a hole arranged in the base 801 during formation of the through-electrode substrate 800, minute spaces are sometimes generated between a side surface 803d of the through-electrode 803 and the base 801. In addition, although the surface 801b of the base 801 and the surface 803b of the through-electrode 803 are polished by CMP and the like after the through-electrode 803 is arranged in the base 801, the base 801 in the vicinity of the periphery edge 803c on the surface 803b side at this time is worn away which may generate spaces. When spaces 881 generated due to this reason are present, the wiring 804 may break leading to connection defects with the through-electrode 803. Alternatively, connection reliability of the wiring 804 drops when gas is filled into the spaces 881.

Figure 27:
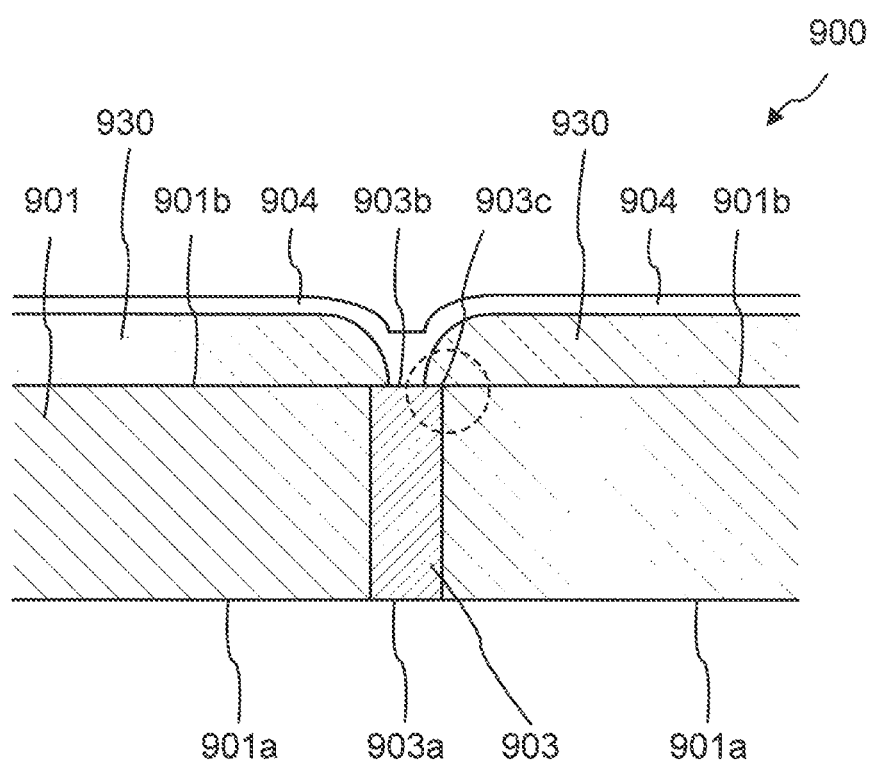
FIG. 27 is a schematic diagram showing a cross-section of a through-electrode substrate.
Figure 28:
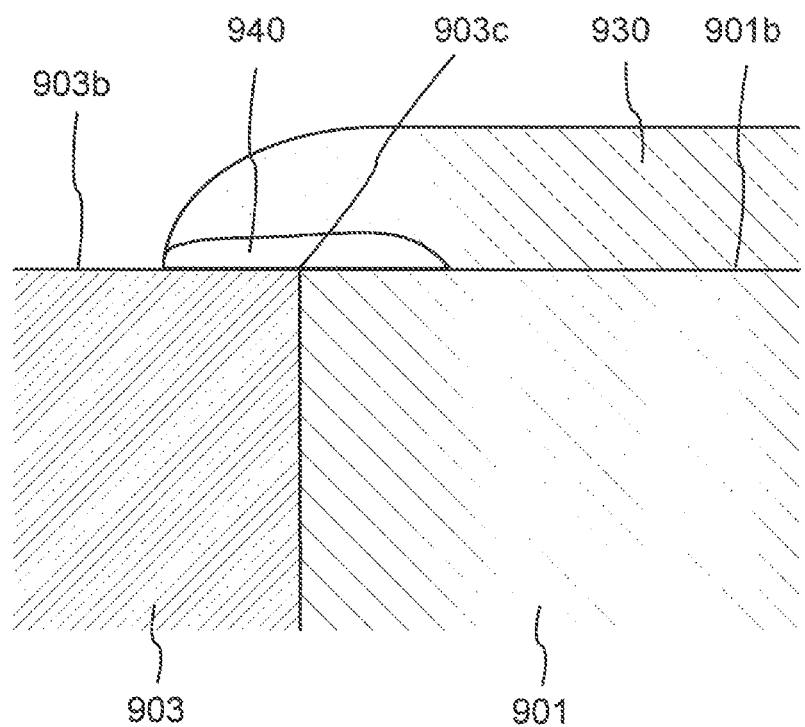
FIG. 28 is a schematic diagram showing a cross-section of a through-electrode substrate.

FIG. 27 and FIG. 28 are cross-sectional diagrams of another state of a through-electrode substrate 900. FIG. 28 shows a formation process of the through-electrode substrate 900 and is an expanded view of the vicinity enclosed by the dotted line in FIG. 27. Referring to FIG. 27, a through-electrode 903 is arranged to pass through a surface 901a and surface 901b of a base 901. Here, surfaces of the through-electrode 903 exposed to the surface 901a side and surface 901b side of the base 901 are given as surface 903a and surface 903b respectively. In addition, a surface which contacts with the base 901 of the through-electrode 903 is given as a side surface 903d. An insulation layer 930 is arranged above the surface 901b of the base 901 and from the surface 901b to a part above the surface 903b of the through-electrode 903. Wiring 904 is arranged above the insulation layer 930 and above the surface 903b of the through-electrode 903 not arranged with the insulation layer 930.

In FIG. 27, the insulation layer 930 is formed above the surface 901b of the base 901 and in a part above the surface 903b of the through-electrode 903. Since the insulation layer 930 is also arranged in the vicinity of a periphery edge 903c of the through-electrode 903, the side surface 903d side of the periphery edge 903c is covered by the base 901 and the surface 903b side of the periphery edge 903c is covered by the insulation layer 930.

The periphery edge 903c of the through-electrode 903 is covered by forming the insulation layer 930. However, when adhesion between the insulation layer 930 and the through-electrode 903 is poor, the insulation layer 930 is under-cut during the manufacturing process which leads to the generation of gaps. Therefore, this causes the wiring 904 to break since the insulation layer 930 becomes deficient in structural stability.

The embodiments of the present disclosure attempt to solve the problems described above and aim to eliminate defects due to structural causes that are generated at a boundary part between a through-electrode and a base, and provide a structurally stable through-electrode substrate.

The through-electrode substrate of the present disclosure is explained in detail below while referring to the diagrams. Furthermore, the through-electrode substrate of the present disclosure is not limited to the embodiments herein and can be carried out by various modifications. All of the embodiments are explained by attaching the same reference symbols to the same structural elements. In addition, the dimension ratios in the diagrams may be different to actual ratios for the purpose of explanation, and parts of the structure may be omitted from the diagrams.

First Embodiment

A structure and manufacturing method of a through-electrode substrate 100 related to the first embodiment of the present disclosure is explained below while referring to FIG. 1 to FIG. 11.
(Overall Structure)

Figure 8A:
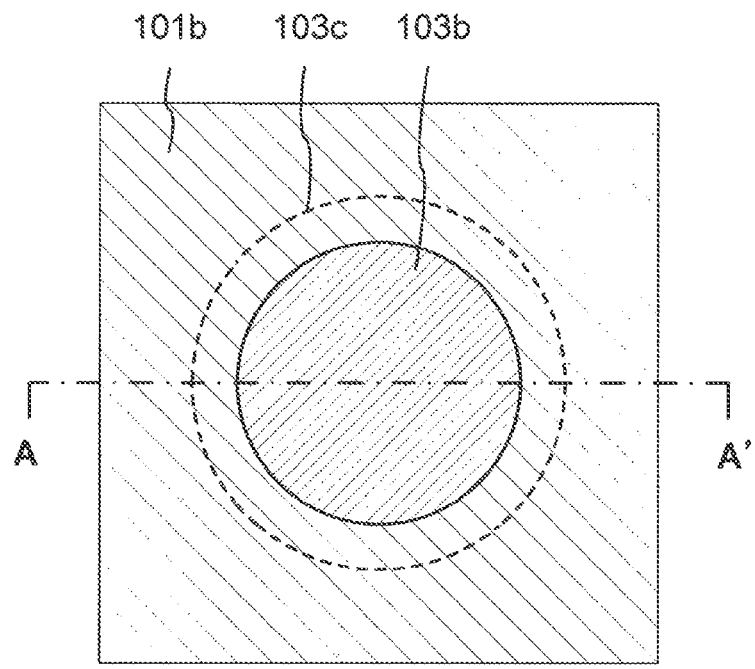
FIG. 8A shows a planar view of a substrate after etching is completed in a manufacturing method of a through-electrode substrate related to the first embodiment of the present disclosure.
Figure 8B:
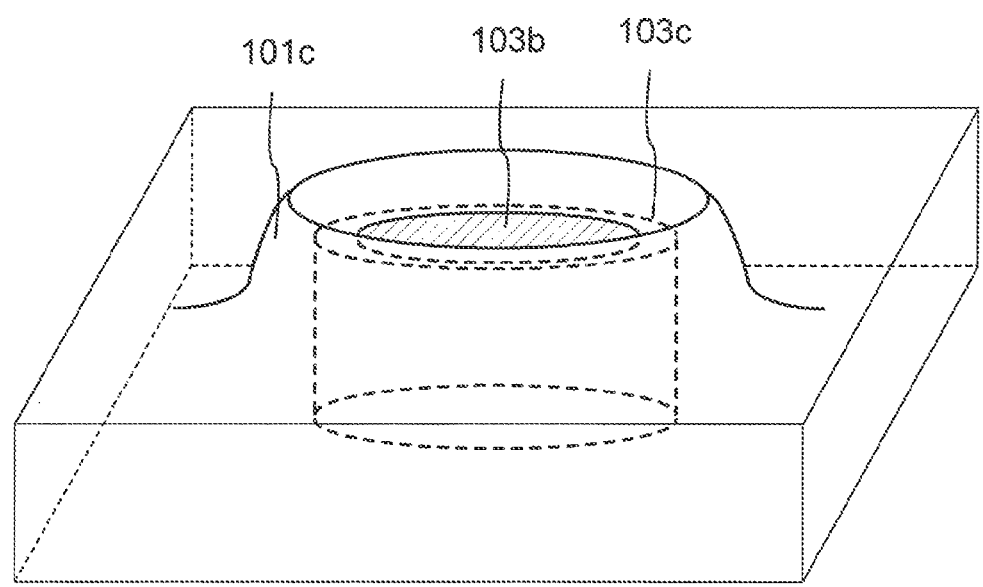
FIG. 8B shows a perspective view of a substrate after etching is completed in a manufacturing method of a through-electrode substrate related to the first embodiment of the present disclosure.

First, a summary of the structure of the through-electrode substrate 100 is explained using FIG. 7, FIG. 8A and FIG. 8B. FIG. 8A and FIG. 8B are a planar diagram and a perspective diagram of the through-electrode substrate 100 related to the first embodiment of the present disclosure. FIG. 8A is a planar diagram seen from a second surface 101b side of a base 101 which forms the through-electrode substrate 100, and FIG. 8B shows a perspective diagram seen from a diagonal direction of the second surface 101b side of the base 101. In addition, FIG. 7 shows a schematic diagram of a cross-section viewed along the line A-A' in FIG. 8A.

The through-electrode substrate 100 is arranged with a through-electrode 103 in the base 101. The base 101 includes a first surface 101a and second surface 101b which mutually oppose each other. The through-electrode 103 has a first surface 103a exposed from the first surface 101a side of the base 101, and a second surface 103b exposed from the second surface 101b side of the base 101. In addition, a side surface 103d of the through-electrode 103 contacts the base 101.

A periphery edge 103c and a periphery thereof of the second surface 103b of the through-electrode 103 are covered by the base 101 and the remaining interior side region is exposed from the base 101. That is, the side surface 103d side and the second surface 103b side of the periphery edge 103c are both covered by the base 101. The part of the base 101 which covers the periphery edge 103c of the through-electrode 103 and the second surface 103b in a periphery thereof has a narrower thickness compared to other parts and a thin region (region with a narrow thickness) 101e is formed.
(Manufacturing Method of Through-Electrode Substrate 100)

Next, a manufacturing method of the through-electrode substrate 100 related to the first embodiment of the present disclosure is explained using FIG. 1 to FIG. 8B.

FIG. 1 shows a cross-section of a substrate arranged with a bottomed hole 102 in the base 101 in the manufacturing method of the through-electrode substrate 100. At least the surface of the base 101 includes insulation properties. For example, glass (blue plate glass, low expansion glass, non-alkali glass etc.), sapphire or a resin is used as the base 101. In this case, the thickness of the base 101 may be formed within a range of 100 μm or more and 1 mm or less.

In addition, the base 101 may be a base having a surface including insulation properties arranged with an insulation film on a surface of a substrate including conductivity. For example, an insulation film may be formed on a surface of a substrate having conductivity such as silicon. In this case, the thickness of the insulation film may be formed within a range of 0.1 μm or more and 5 μm or less. Furthermore, in the case where a substrate including silicon is used as the base 101, it is preferred to arrange an insulation film on an inner wall surface of the final through-hole by forming an insulation film on an inner wall surface of a bottomed hole 102. However, in this case, an etching process for removing the insulation film becomes necessary as is described herein in FIG. 7.

The base 101 includes the first surface 101a and second surface 101b mutually opposing each other. A mask (not shown in the diagram) is formed on the first surface 101a side of the base 101, and the bottomed hole 102 is formed by etching. It is possible to form the bottomed hole 102 without passing through to the second surface 101b side of the base 101 by a dry etching process such as RIE (Reactive Ion Etching) and DRIE (Deep RIE), a wet etching process or by a laser etching process.

Although the depth of the bottomed hole 102 depends on the depth of the base 101, it is possible to set the depth to 100 μm or more and 500 μm or less for example. There is no particular limitation to the size of the opening of the bottomed hole 102 and may be set to 10 μm or more and 100 μm or less for example. In addition, the shape of the bottomed hole 102 may have a straight shape in the thickness direction of the base 101 as typically shown in each diagram but is not limited to this shape. For example, a taper shape may be formed by widening the opening part of the first surface 101a side and narrowing the bottom part of the second surface 101b side. In addition, the center part of the bottomed hole 102 may be formed in a convex shape, a concave shape or a combination of these. Furthermore, there is no particular limitation to the shape of the bottomed hole 102 seen from a planar view and while typically is a circular shape, may also be a shape other than a circle such as a rectangle or polygon.

Next, the formation of the through-electrode 103 is explained. FIG. 2 is a cross-sectional diagram showing a state in which the through-electrode 103 is formed in the bottomed hole 102. The through-electrode 103 is formed by arranging a conductive material so as to bury the bottomed hole 102. A metal such as Cu for example is used as the conductive material. It is possible to use an electrolytic plating filling method in the case where a metal such as Cu is used as the through-electrode 103. In the case of using an electrolytic plating filling method, the electrolytic plating is performed after forming a seed layer, that is, a ground layer for plating formation (not shown in the diagram). In addition, in the case of forming a pattern by electrolytic plating, a part which forms the plating is exposed by a resist manufactured by a lithography method. The first surface 101a of the base 101 and the first surface 103a of the through-electrode 103 are leveled by CMP (Chemical Mechanical Polishing) and the like after filling the through-electrode 103.

Here, the opening side (first surface 101a side of the base 101) of the bottomed hole 102 of the through-electrode 103 arranged in the bottomed hole 102 is set as the first surface 103a, and the bottom side (second surface 101b side of the base 101) of the bottomed hole 102 is set as the second surface 103b. An end part of the second surface 103b is set as the periphery edge 103c. In addition, a surface which contacts the base 101 except the first surface 103a and second surface 103b is set as the side surface 103d.

Next, formation of a mask 130 is explained. FIG. 3 is a cross-sectional diagram showing a state in which a mask 130 for etching is formed on the second surface 101b side of the base 101. The mask 130 is arranged on the second surface 101b of the base 101 and arranged in the vicinity of the periphery edge 103c of the second surface 103b of the through-electrode 103 when viewed from through the second surface 101b. At this time, at least a part of the mask 130 is arranged so as to be positioned further to the interior than the periphery edge 103c. Arranging the mask 130 in this way is for delaying etching in the vicinity of the periphery edge 103c of the second surface 103b of the through-electrode 103 when performing isotropic etching of the second surface 101b of the base 101 after arrangement of the mask 130 so that the periphery edge 103c of the second surface 103b of the through-electrode 103 is not exposed.

In the case where the through-electrode 103 has a cylindrical shape, the mask 130 is arranged in a ring shape following the periphery edge 103c of the through-electrode 103 above the second surface 101b of the base 101. In the case where the through-electrode 103 has a shape other than a cylindrical shape, the mask 130 is arranged along the planar viewed shape of the second surface 103b of the through-electrode 103.

After the mask 130 is arranged, isotropic etching is performed from the opposite side of the first surface 101a of the base 101 formed with the bottomed hole 102, that is, the second surface 101b side of the base 101 which is the bottom side of the bottomed hole 102. A wet etching process is explained as an example of isotropic etching. In the case where the base 101 is glass, hydrofluoric acid for example is used as the etching liquid. In this case, a material having resistance to hydrofluoric acid is used for the mask 130. For example, in the case when chrome or copper and the like are used, the mask 130 is formed by patterning chrome or copper and the like by photolithography. Furthermore, before wet etching is performed, a protection layer is formed in advance so that the first surface 101a side of the base 101 is not etched.

FIG. 4 to FIG. 7 are cross-sectional diagrams showing a state in which isotropic etching proceeds. In particular, FIG. 7 is a cross-sectional diagram showing a state in which isotropic etching is completed and shows the through-electrode substrate 100 related to the first embodiment of the present disclosure.

Referring to FIG. 4 and FIG. 5, during initial isotropic etching, it can be seen that a part arranged with the mask 130 at the second surface 101b of the base 101 is not etched. However, since etching proceeds in a horizontal direction from the part not arranged with the mask 130 as isotropic wet etching proceeds, etching also gradually proceeds of the part where the mask 130 is not arranged. FIG. 6 shows a state in which the mask 130 is peeled away as a result of a part of the second surface 101b of the base 101 contacting the mask 130 being completely etched.

Etching proceeds from FIG. 6 and is carried out until the state shown in FIG. 7 is finally achieved. Referring to FIG. 7, the base 101 in the vicinity of the periphery edge 103c of the second surface 103b of the through-electrode 103 is not completely etched and a part of the base 101 remains as the thin region 101e. On the other hand, etching of the second surface 103b apart from the vicinity of the periphery edge 103c of the through-electrode 103 proceeds and is exposed from the base 101. That is, the through-electrode 103 is arranged in a through-hole which passes between the first surface 101a and the second surface 103b of the base 101. In this way, by not completely etching a part of the base 101 in the vicinity of the periphery edge 103c of the through-electrode 103, the periphery edge 103c of the through-electrode 103 and the second surface 103b in the vicinity thereof become covered by the base 101.

Here, a state of a substrate in which the isotropic etching shown in FIG. 7 is completed is explained again using FIG. 8A and FIG. 8B. FIG. 8A is a planar view diagram seen from the second surface 101b side of the base 101. The periphery edge 103c and a vicinity thereof of the second surface 103b of the through-electrode 103 are covered by a part of the second surface 101b of the base 101. On the other hand, the region on the interior side of the second surface 103b of the through-electrode 103 is exposed from the second surface 101b of the base 101.

FIG. 8B is a perspective view diagram seen from a diagonal direction of the second surface 101b side of the base 101. Referring to FIG. 8B, it can be seen that a ring shaped convex part 101c is formed in a part arranged with the periphery edge 103c of the through-electrode 103 formed in a circular shape to a part positioned further to the exterior side of this part. The convex part 101c is formed since procession of etching of a part arranged with the mask 130 is slower compared to a part not arranged with the mask 130. By forming the convex part 101c, the side surface 103d side of the periphery edge 103c of the through-electrode 103 and the second surface 101b side both become covered by the base 101.

Figure 10:
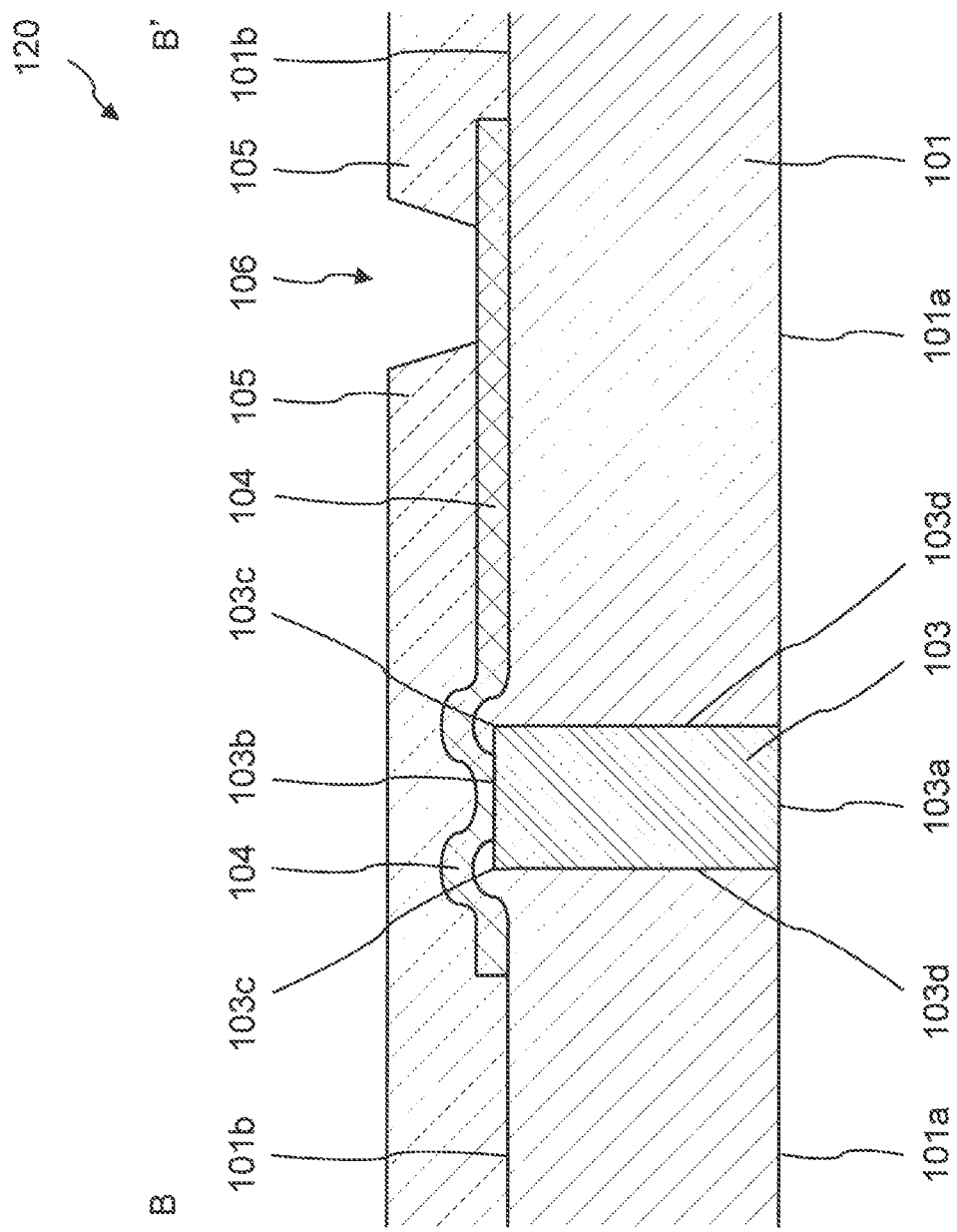
FIG. 10 is a schematic diagram showing a cross-section of a substrate arranged with an insulation layer in a manufacturing method of a through-electrode substrate related to the first embodiment of the present disclosure.
Figure 11:
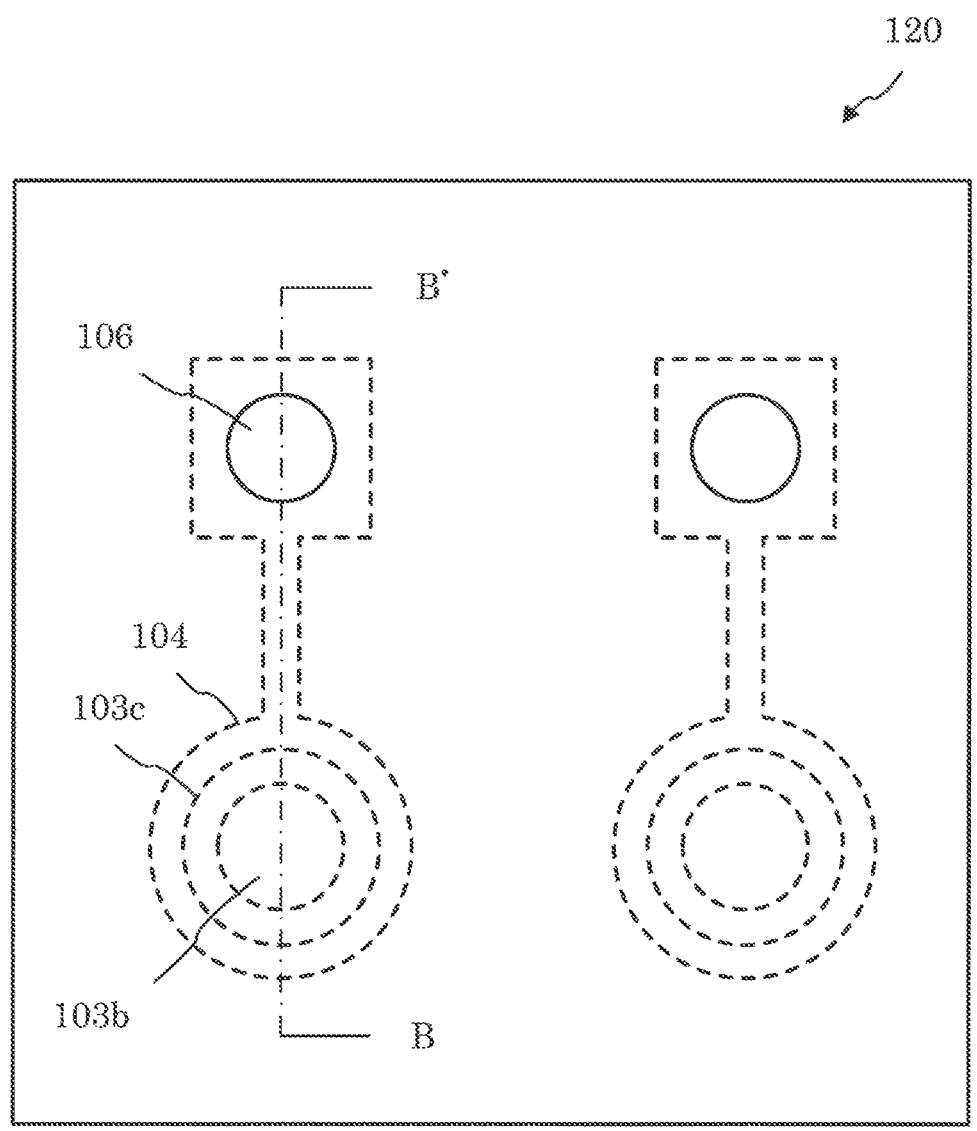
FIG. 11 is an upper surface diagram for explaining a through-electrode of a through-electrode substrate related to the first embodiment of the present disclosure.

Next, a method of forming a wiring layer 104 and insulation layer 105 in the through-electrode substrate 100 is explained using FIG. 9 to FIG. 11.

FIG. 9 is a cross-sectional diagram of the through-electrode substrate 100 formed with a wiring layer 104 above the second surface 101b of the base 101 and the second surface 103b of the through-electrode 103. A conductive material is used for the wiring layer 104. The conductive material is formed for example by a method of coating a metal material on the second surface 101b side of the base 101 and performing patterning using photolithography. Furthermore, although not shown in FIG. 9, electronic components other than the wiring layer 104 may also be mounted.

Next, formation of the insulation layer 105 is explained using FIG. 10. FIG. 10 shows a cross-section of a through-electrode substrate 120 further formed with the insulation layer 105 from FIG. 9, and is a cross-sectional diagram seen from the direction B-B' in FIG. 11. A photosensitive resin is used for example for the insulation layer 105. In this case, after forming the photosensitive resin above the second surface 101b of the base 101 and above the wiring layer 104, patterning is performed using photolithography and the insulation layer 105 is formed by baking. In addition, an opening part 106 is formed up to the wiring layer 104 in the insulation layer 105.

FIG. 11 is an upper surface diagram seen from the insulation layer 105 side of the through-electrode substrate 120. The wiring layer 104 is formed so as to enclose the periphery edge 103c of the circular through-electrode 103. The wiring layer 104 is further formed extending from the through-electrode 103 to the opening part 106 so as to enclose a region formed with the opening part 106 in a rectangle shape. Furthermore, a circle shown on the inner side of a circle which shows the periphery edge 103c of the through-electrode 103 shows a region exposed from the second surface 101b side of the base 101 in the second surface 103b of the through-electrode 103.

As explained above, in the formation of the through-electrode substrate 100 related to the first embodiment, although there is a process for leaving the base 101 in the vicinity of the periphery edge 103c of the through-electrode 103, there is no process for polishing the second surface 103b of the through-electrode 103 and the second surface 101b of the base 101. Therefore, as explained using FIG. 25 and FIG. 26, problems such as damage to a base 801 which occur due to polishing of a surface 803b of a through-electrode 803 and a surface 801b of the base 801, breaks in a wiring layer 804 that come with damage to the base 801, or a drop in reliability of a connection of the wiring layer 804 due to gaps being generated between the base 801 and through-electrode 803 do not occur in the through-electrode substrate 100 related to the first embodiment.

Furthermore, in the through-electrode substrate 100 related to the first embodiment, the side surface 103d side of the periphery edge 103c of the second side 103b of the through-electrode 103 and also the second surface 103b side are covered by the base 101. On the other hand, in another conventional through-electrode substrate explained in FIG. 27 and FIG. 28, although a side part of the periphery edge 903c of the through-electrode 903 is covered by a base 901 and an upper surface is covered by an insulation layer 930, the insulation layer 930 is undercut during a formation process which produces gaps leading to a loss in structural stability. Therefore, the through-electrode substrate 100 related to the first embodiment does not have a structure corresponding to the insulation layer 930 in a conventional through-electrode substrate, and since such a formation process does not exist, the problems described above which occur during the formation of the insulation layer 930 are not generated.

Therefore, it is possible to provide a structurally stable through-electrode substrate using the through-electrode substrate 100 and manufacturing method thereof related to the first embodiment.

Modified Example

Figure 12:
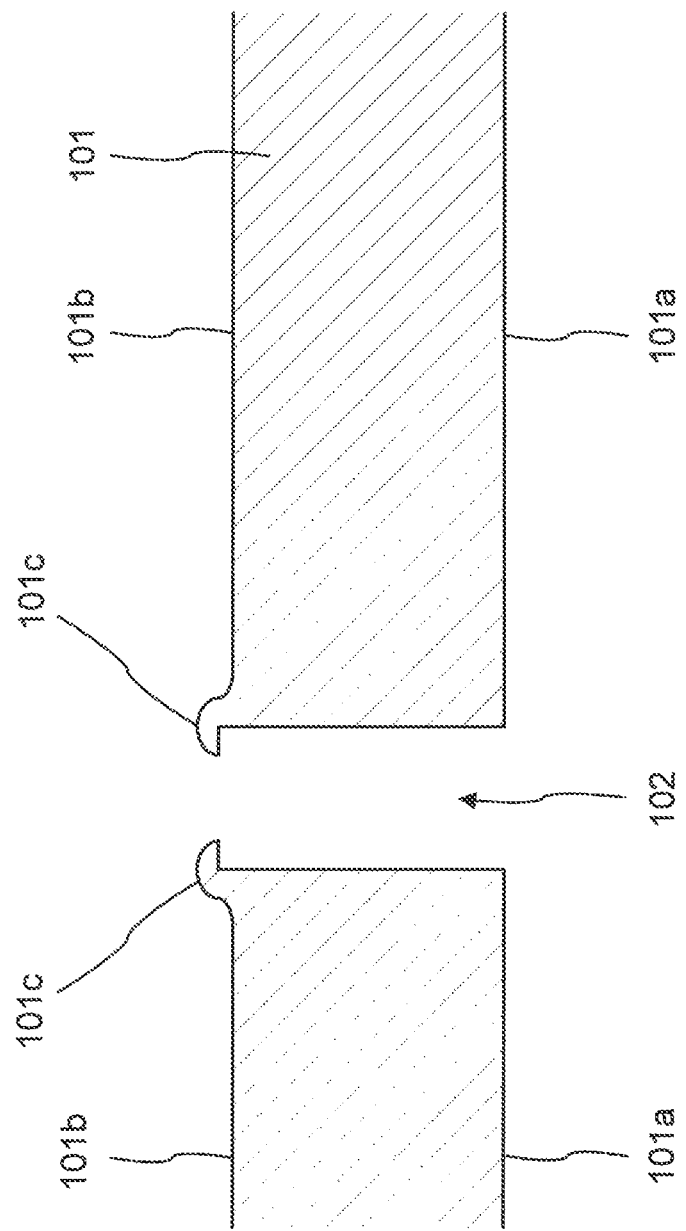
FIG. 12 is a schematic diagram showing a cross-section of a substrate after etching is competed in a manufacturing method of a through-electrode substrate related to a modified example of the first embodiment of the present disclosure.
Figure 13:
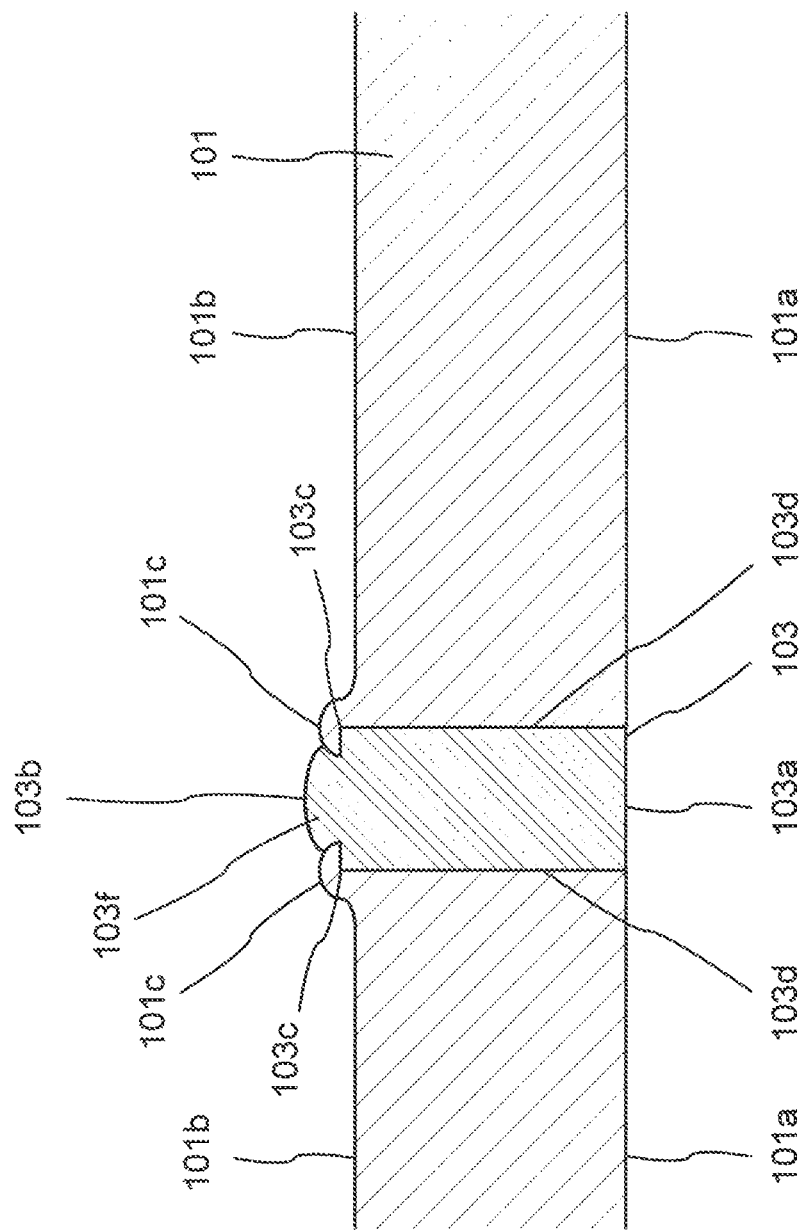
FIG. 13 is a schematic diagram showing a state of a through-electrode protruding further than a convex part of a substrate in a manufacturing method of a through-electrode substrate related to a modified example of the first embodiment of the present disclosure.
Figure 14:
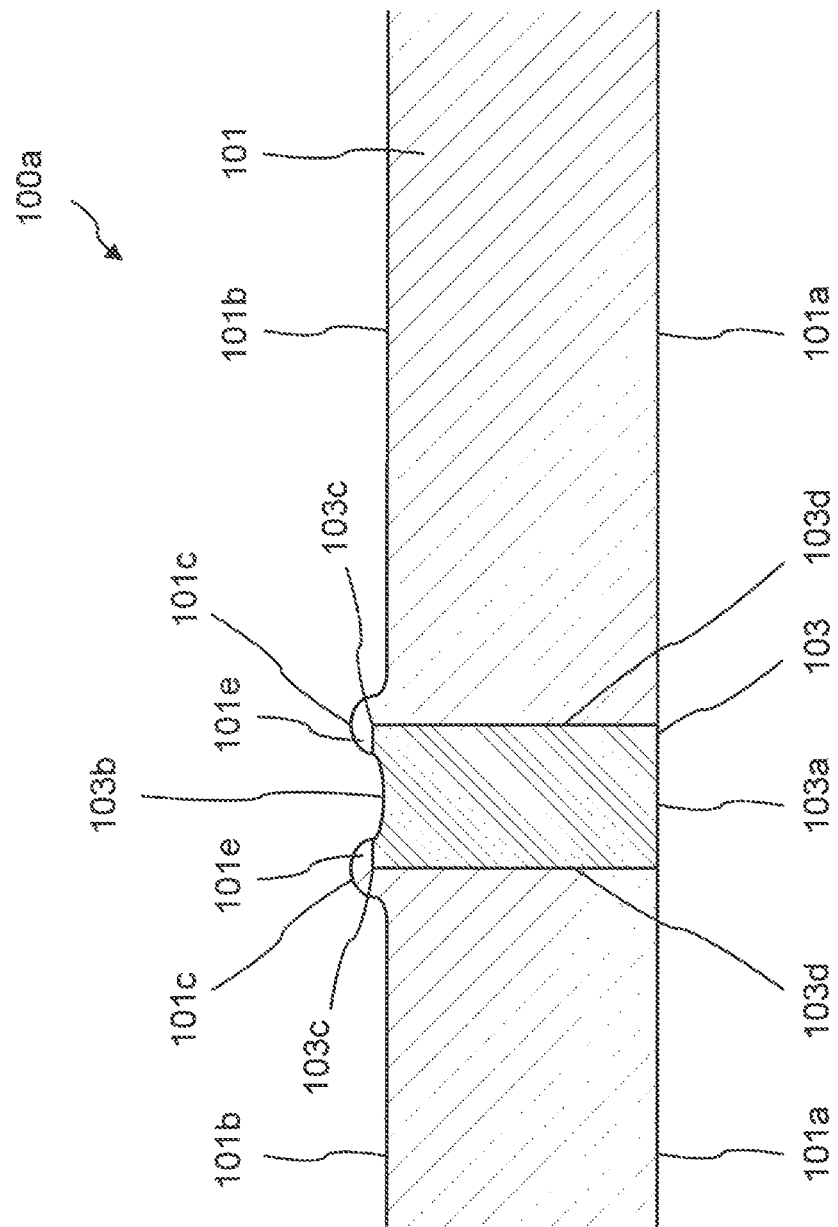
FIG. 14 is a schematic diagram showing a state in which a through-electrode protruding further than a convex part of a substrate is leveled in a manufacturing method of a through-electrode substrate related to a modified example of the first embodiment of the present disclosure.

Next, a modified example in the first embodiment of the present disclosure is explained using FIG. 12 to FIG. 14.

In the first embodiment, the bottomed hole 102 was formed in the first surface 101a side of the base 101 including the first surface 101a and second surface 101b mutually opposing each other, etching was performed from the second surface 101b side of the base 101 after filling the through-electrode 103 into the bottomed hole 102, and the through-electrode 103 was exposed. In the modified example, after forming the bottomed hole 102 in the first surface 101a side of the base 101, etching is performed in advance from the second surface 101b side of the base 101 without forming the through-electrode 103 in the bottomed hole 102.

FIG. 12 shows a state in which a bottom part of the bottomed hole 102 is penetrated by etching from the second surface 101b side of the base 101 after forming the bottomed hole 102 in the base 101. Etching in the modified example 1 is performed by the same method explained in the first embodiment. That is, FIG. 12 shows a state in which the formation process of the through-electrode 103 shown in FIG. 2 in the first embodiment is omitted and the etching process shown in FIG. 3 to FIG. 7 is performed.

After penetrating the bottom of the bottomed hole 102 by etching, the through-electrode 103 is formed by filling a metal from the original opening side of the bottomed hole 102. Since a metal is filled after penetrating the bottom of the bottomed hole 102, it becomes easier for unnecessary gas to escape when filling the metal and it is more difficult for bubbles to occur in the through-electrode 103. When the through-electrode 103 is formed, the same through-electrode substrate 100 as explained in FIG. 7 in the first embodiment is formed.

However, in the modified example 1, the second surface 103b of the through-electrode 103 may protrude further than the convex part 101c when the through-electrode 103 is formed as shown in FIG. 13 (refer to 103f in FIG. 13). In such a case, the second surface 103b is leveled by CMP and the like after the through-electrode 103 is formed. FIG. 14 is a diagram showing a state in which the second surface 103b is leveled and a through-electrode substrate 100a related to the modified examples of the first embodiment is formed. When CMP is performed, since the center part of the second surface 103b of the through-electrode substrate 100a is dented due to a dishing phenomenon, appropriate adjustment is performed so that dents are not excessively produced in a center part.

Second Embodiment

Next, the structure and manufacturing method of a through-electrode substrate 200 related to a second embodiment of the present disclosure are explained using FIG. 1, FIG. 2, FIG. 8A and FIG. 15 to FIG. 18.
(Overall Structure)

Figure 18:
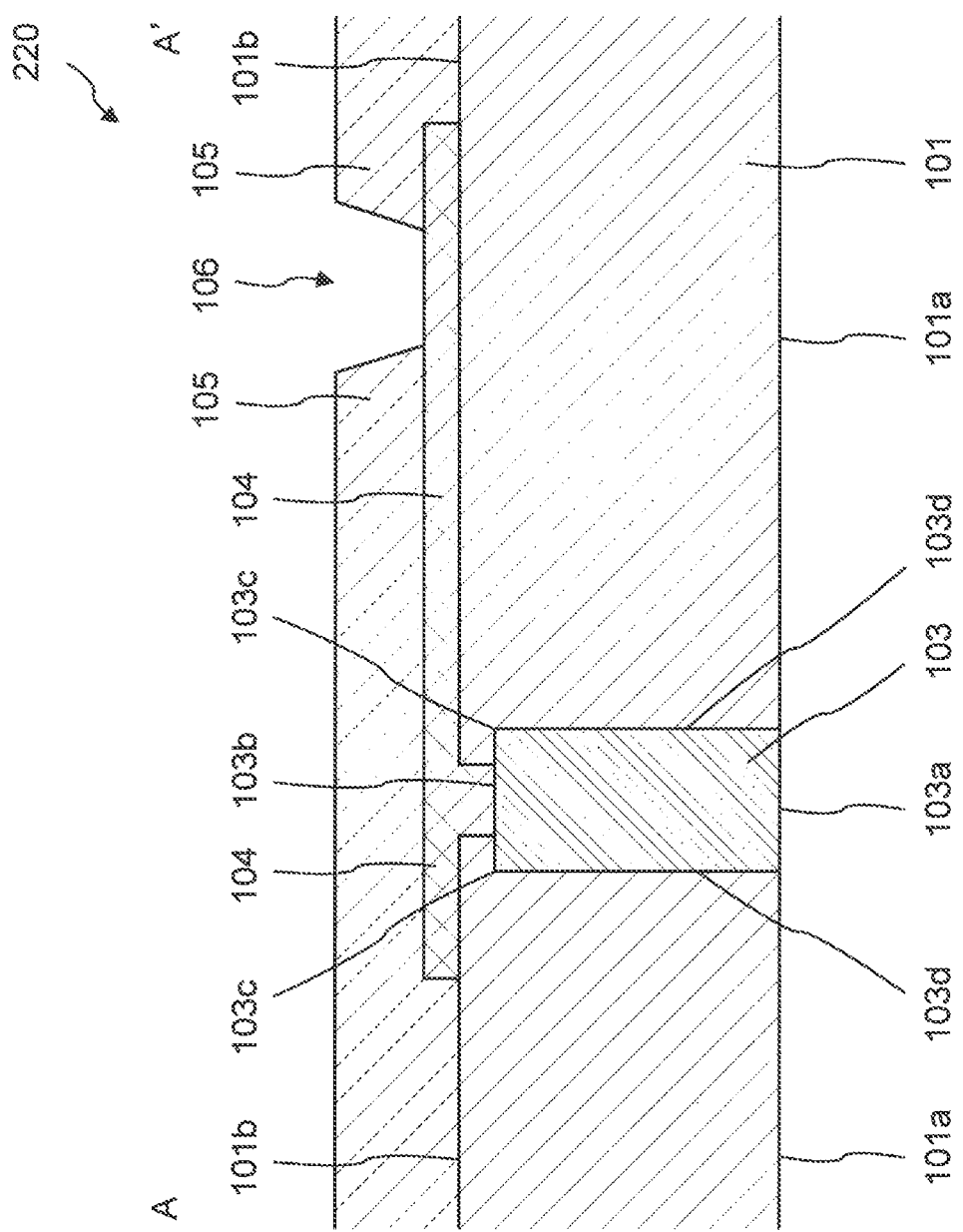
FIG. 18 is a schematic diagram showing a cross-section of a substrate arranged with a wiring layer and an insulation layer in a manufacturing method of a through-electrode substrate related to the second embodiment of the present disclosure.

An upper surface view diagram of the through-electrode substrate 200 related to a second embodiment is the same as FIG. 8A used in the explanation of the first embodiment. In addition, FIG. 18 shows a schematic view of a cross-section when viewed in the direction A-A' in FIG. 8A.

The through-electrode substrate 200 is arranged with the through-electrode 103 in the base 101. The base 101 includes the first surface 101a and second surface 101b mutually opposing each other. The first surface 103a of the through-electrode 103 is exposed from the first surface 101a side of the base 101 and the second surface 103b is exposed from the second surface 101b side of the base 101. In addition, the side surface 103d of the through-electrode 103 contacts the base 101.

The side surface 103d side and second surface 103b side of the periphery edge 103c of the through-electrode 103 are both covered by the base 101. Although almost the entire base 101 has a constant thickness, the thickness of a part which covers the second surface 103b of the through-electrode 103 is narrower compared to other parts and a thin region (region with a narrow thickness) 101e is formed.

(Manufacturing Method of Through-Electrode Substrate 200)

The manufacturing method up to forming the bottomed hole 102 in the base 101 and filling the through-electrode 103 in the second embodiment is the same as the manufacturing method of the through-electrode substrate 100 in the first embodiment explained using FIG. 1 and FIG. 2.

Figure 15:
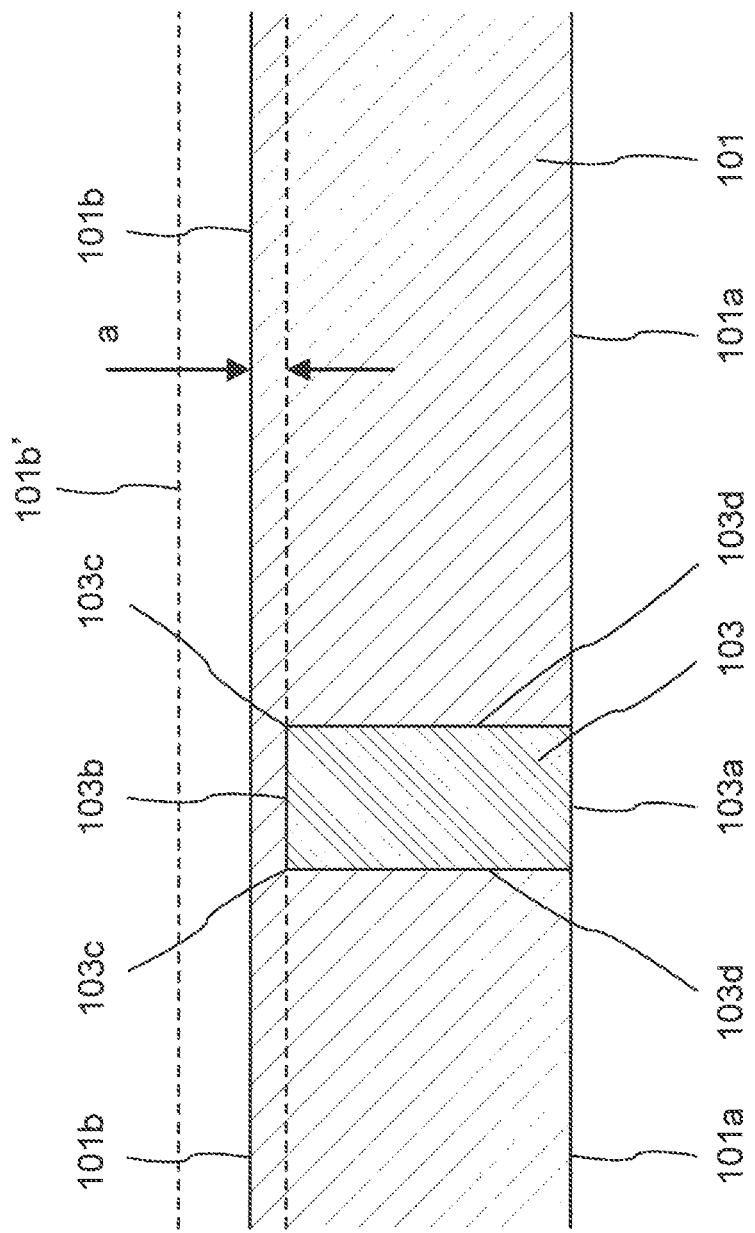
FIG. 15 is a schematic diagram showing a cross-section of a substrate during etching in a manufacturing method of a through-electrode substrate related to a second embodiment of the present disclosure.

FIG. 15 is a diagram showing a state in which etching is performed across the entire second surface 101b from the second surface 101b side of the base 101 from the state shown in FIG. 2. Wet etching, dry etching or laser etching may be used as the etching method. Furthermore, the dotted line 101b' shows the position of the second surface 101b of the base 101 before etching is performed. Etching is stopped before the second surface 103b of the through-electrode 103 is exposed, and a thickness a is left between the second surface 101b of the base 101 and the second surface 103b of the through-electrode 103.

In the case where etching is performed using isotropic wet etching, hydrofluoric acid for example is used as the etching liquid and a protection layer is formed in advance so that the first surface 101a side of the base 101 is not etched. In this case, etching is performed so that the thickness a becomes 30 μm or less for example. This is because when the thickness a becomes large in an etching process after masking described herein, the effects due to the procession of etching in a horizontal direction in addition to etching in a thickness direction of the base 101 can no longer be ignored. In addition, since uneven etching occurs when wet etching is performed, it is desired that the thickness a is 1 μm or more.

In addition, there is no particular upper limit to the thickness a in the case where the etching process is performed by anisotropic dry etching such as RIE or D-RIE. However, it is desired that the thickness a is 1 μm or more.

Figure 16:
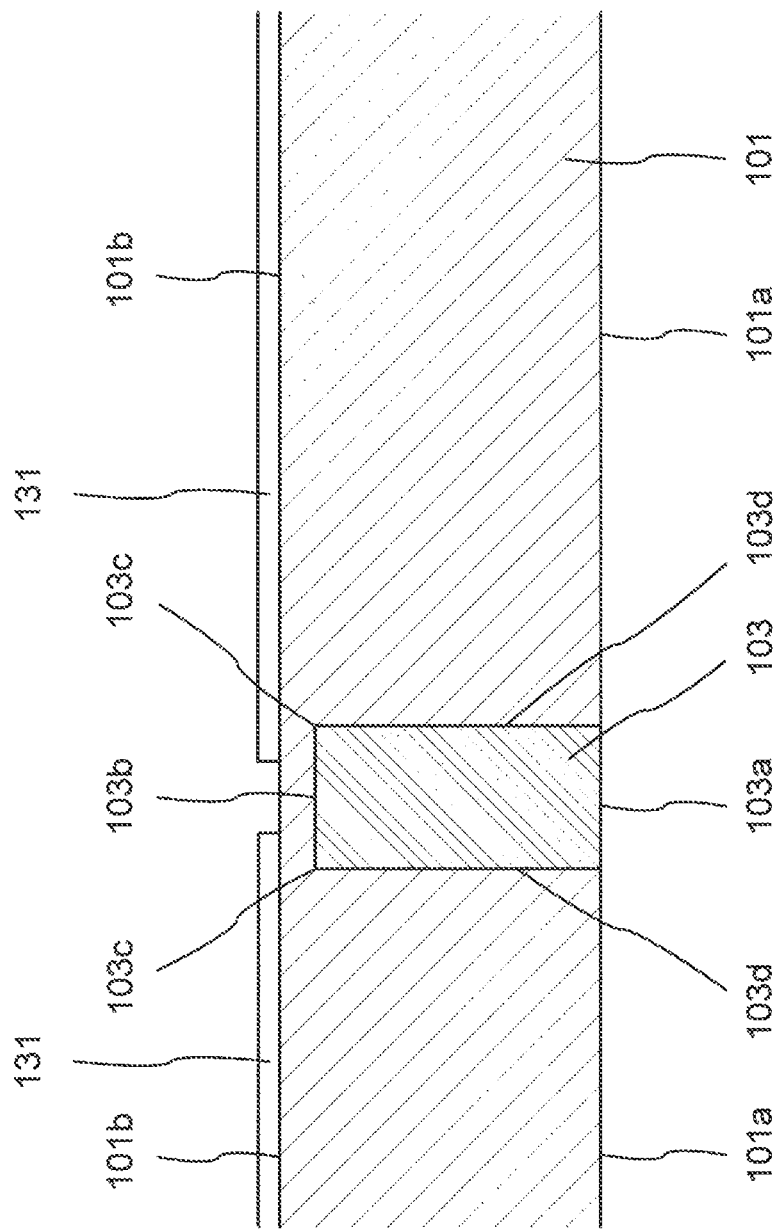
FIG. 16 is a schematic diagram showing a cross-section of a substrate arranged with a mask in a manufacturing method of a through-electrode substrate related to the second embodiment of the present disclosure.

Next, mask formation for exposing the through-electrode 103 from the second surface 101b of the base 101 is explained. FIG. 16 is a cross-sectional diagram showing a state in which a mask 131 is formed on the second surface 101b of the base 101. Furthermore, the arrangement of the mask shown in FIG. 16 shows mask formation in the case where the etching process after mask formation is performed by anisotropic etching.

In the second embodiment, in order to expose the second surface 103b of the through-electrode 103 from the base 101, the mask 131 is not formed on a region of the second surface 103b of the through-electrode 103 to be exposed but is formed in all other parts. More specifically, the mask 131 is formed from the side where the through-electrode 103 is absent up to a part which exceeds the periphery edge 103c of the through-electrode 103 when viewed from through the second surface 101b side of the base 101, and is formed so that the mask 131 and periphery edge 103c overlap each other. The mask 131 is formed by patterning a resist for example.

Figure 17:
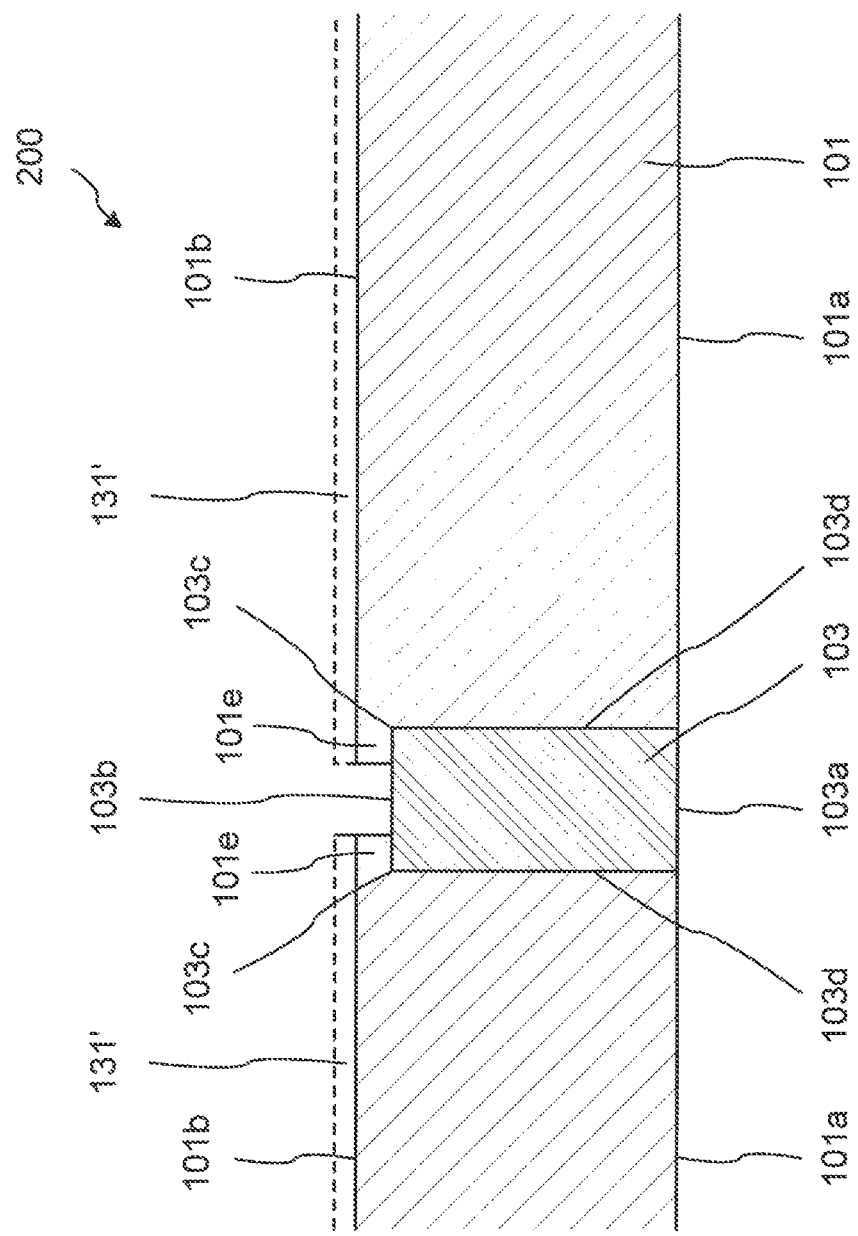
FIG. 17 is a schematic diagram showing a cross-section of a substrate after etching is completed in a manufacturing method of a through-electrode substrate related to the second embodiment of the present disclosure.

Next, etching for exposing the through-electrode 103 from the second surface 101b of the base 101 is explained. FIG. 17 is a diagram showing a state after anisotropic etching is performed from the state shown in FIG. 16, and shows a cross-section of the through-electrode substrate 200 related to the second embodiment of the present disclosure.

The base 101 not arranged with the mask 131 is etched by anisotropic etching. As described above, since the mask 131 is formed so as to overlap the periphery edge 103c, the second surface 103b of the through-electrode 103 is exposed from the base 101 with a part in the vicinity of the periphery edge 103c remaining. Since the mask 131 is arranged up to a part which exceeds the periphery edge 103c of the through-electrode 103, the side surface 103d side and second surface 103b side of the vicinity of the periphery edge 103c remain without the base 101 being etched. A section where the mask 131 is arranged is shown by 131' in the diagram. The mask 131 is peeled away after the anisotropic etching process is completed.

FIG. 18 shows a cross-sectional view of a through-electrode substrate 220 further formed with the wiring layer 104 and insulation layer 105 in the through-electrode substrate 200 shown in FIG. 17. The method for forming the wiring layer 104 and the insulation layer 105 after etching is completed is the same as in the first embodiment.

As explained above, the side surface 103d side and second surface 103b side of the periphery edge 103c of the second surface 103b of the through-electrode 103 are both covered by the base 101 also in the through-electrode substrate 200 related to the second embodiment. In addition, the manufacturing method of the through-electrode substrate 200 related to the second embodiment is the same as the manufacturing method of the through-electrode substrate 100 related to the first embodiment, and the problems in the manufacturing method in the conventional technology explained in FIG. 25 to FIG. 28 do not occur. Therefore, the through-electrode substrate 200 can provide a structurally stable through-electrode substrate the same as the first embodiment.

Third Embodiment

Figure 19A:
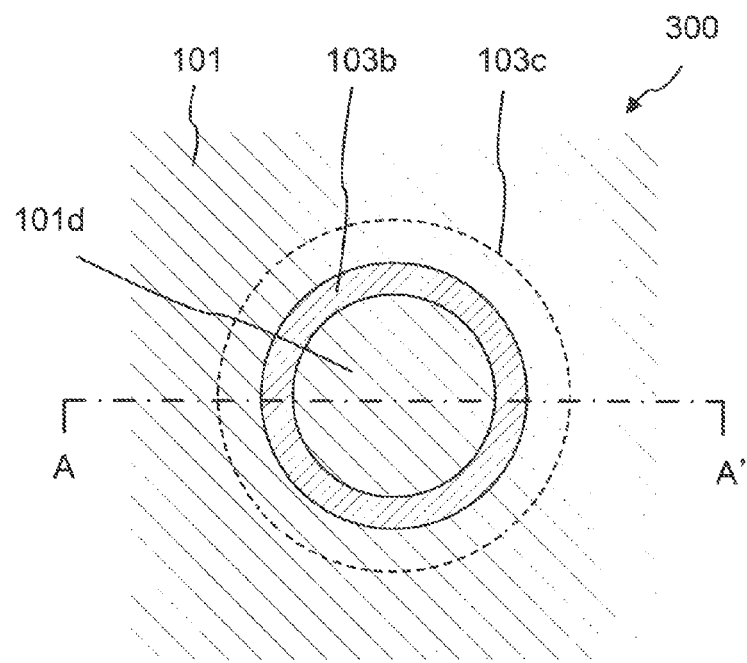
FIG. 19A is a schematic diagram showing an upper surface of a through-electrode substrate related to a third embodiment of the present disclosure.
Figure 19B:
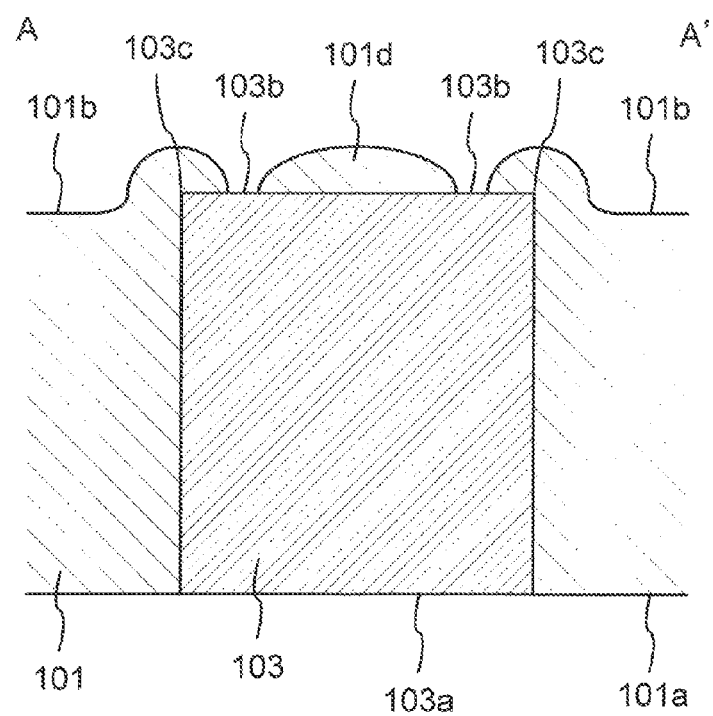
FIG. 19B is a schematic diagram showing a cross-section of a through-electrode substrate related to the third embodiment of the present disclosure.
Figure 20A:
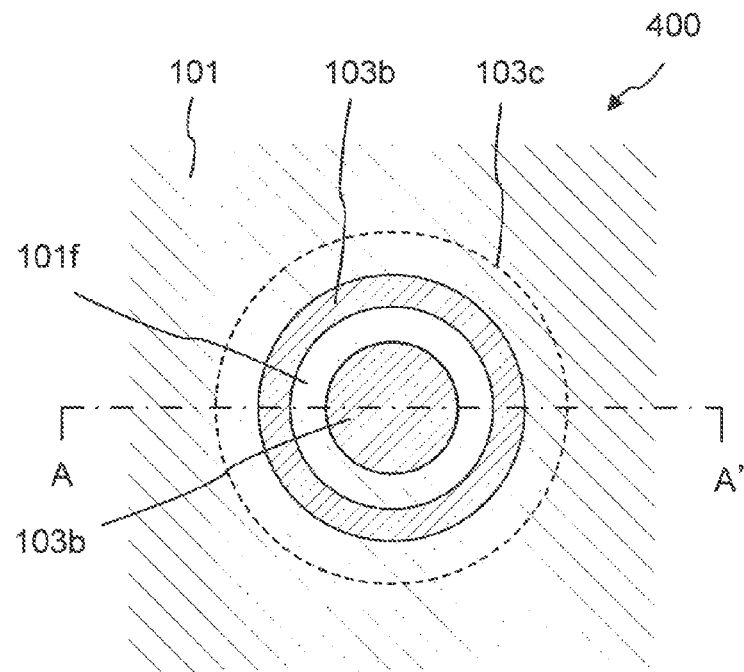
FIG. 20A is a schematic diagram showing an upper surface of a through-electrode substrate related to the third embodiment of the present disclosure.

Next, a structure of through-electrode substrates 300 and 400 related to a third embodiment of the present disclosure is explained while referring to FIG. 19A, FIG. 19B and FIG. 20A.

Although the second surface 103b of the through-electrode 103 is completely exposed from the base 101 while the vicinity of the periphery edge 103c remains in the first embodiment and second embodiment, the present disclosure is not limited to this structure. Sections apart from the vicinity of the periphery edge 103c of the through-electrode 103 may also be left without removing a part of the base 101 using a resist process.

FIG. 19A and FIG. 19B are a planar view and cross-sectional view of a through-electrode substrate 300 related to the third embodiment. Referring to FIG. 19A and FIG. 19B, it can be seen that the circular island shaped base 101d is arranged near the center of the through-electrode 103. Here, the second surface 103b of the through-electrode 103 is formed with an opening part in a ring shape.

Figure 20B:
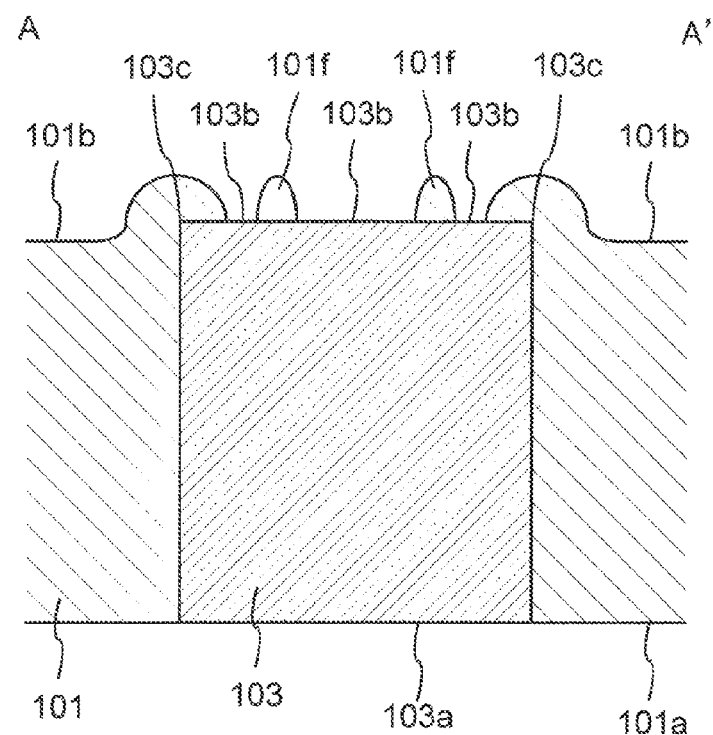
FIG. 20B is a schematic diagram showing a cross-section of a through-electrode substrate related to the third embodiment of the present disclosure.

FIG. 20A and FIG. 20B are a planar view and cross-sectional view of a through-electrode substrate 400 related to the third embodiment. Referring to FIG. 20A and FIG. 20B, it can be seen that the ring shaped base 101f is arranged near the center of the through-electrode 103. Here, the second surface 103b of the through-electrode 103 is formed with a ring shaped opening part positioned on the outer side of the base 101f which is left in a ring shape, and a circular shaped opening part positioned on the inner side of the base 101f which is left in a ring shape.

By appropriately selecting a pattern for masking the second surface 101b of the base 101 using a resist, the opening part of the second surface 103b of the through-electrode 103 may be formed into shapes other than those shapes shown in FIG. 19A, FIG. 19B, FIG. 20A and FIG. 20B. Furthermore, in order to make formation of the opening part of the second surface 103b of the through-electrode 103 in the third embodiment easier, the area of the second surface 103b of the through-electrode 103 may be set wider than in the first embodiment and second embodiment.

In this way, by appropriately setting the shape and width of an opening part of the second surface 103b of the through-electrode 103, it is possible to adjust a resistance value between the through-electrode 103 and a wiring layer (not shown in the diagram) arranged above the second surface 103b of the through-electrode 103 and the second surface 101b of the base 101.

In addition, since unevenness of the second surface 103b side of the through-electrode 103 increases in the third embodiment compared to the first embodiment and second embodiment, adhesion is improved when arranging a wiring layer or when stacking other insulation layers.

Fourth Embodiment

Figure 21:
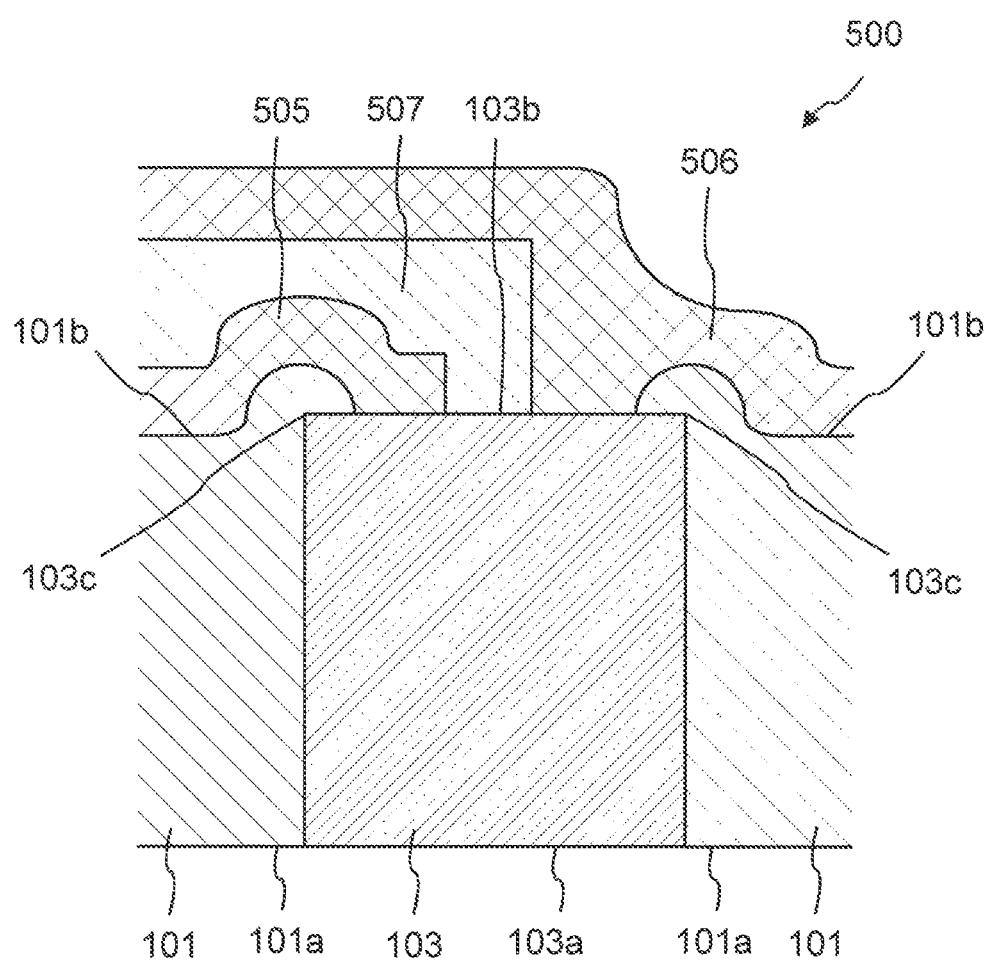
FIG. 21 is a schematic diagram showing a cross-section of a through-electrode substrate related to a fourth embodiment of the present disclosure.

Next, a structure of a through-electrode substrate 500 related to a fourth embodiment of the present disclosure is explained while referring to FIG. 21. In the fourth embodiment, a first wiring 505 and a second wiring 506 are formed connected to the second surface 103b of the through-electrode 103.

An example of a manufacturing method of the through-electrode substrate 500 related to the fourth embodiment is explained. First, the base 101 and through-electrode 103 are formed up to the state shown in FIG. 8A and FIG. 8B in the first embodiment. Next, the first wiring 505 is formed above the second surface 101b of the base 101 and above a part of the second surface 103b of the through-electrode 103 adjacent to the second surface 101b of the base 101 on the left side in FIG. 21. Next, an insulation layer 507 is formed above the first wiring 505 and above a part of the second surface 103b of the through-electrode 103 adjacent to the first wiring 505. Finally, the second wiring 506 is formed above the insulation layer 507, above the second surface 103b of the through-electrode 103 and above the second surface 101b of the base 101 on the right side of the diagram. Here, although the first wiring 505 and second wiring 506 are mutually and electrically connected via the through-electrode 103, since the first wiring 505 and second wiring 506 are formed via the insulation layer 507, parts other than these are not electrically connected.

The manufacturing method of the through-electrode substrate 500 related to the fourth embodiment is not limited to the manufacturing method described above. For example, the first wiring 505, insulation layer 507 and second wiring 506 may be similarly formed above the through-electrode substrate 200 explained in the second embodiment. In addition, as explained in the third embodiment, two opening parts may be formed above the second surface 103b of the through-electrode 103, and the first wiring 505 and second wiring 506 may be formed respectively connected in the formed opening parts.

In addition, a wiring layer and an insulation layer may be formed so that three or more wirings are connected above the second surface 103b of the through-electrode 103.

According to the through-electrode substrate 500 related to the fourth embodiment, since a plurality of wirings is connected via the though-electrode 103, it is possible to realize wiring branches above the through-electrode 103.

Fifth Embodiment

A semiconductor device 1000 manufactured using the through-electrode substrates in the first to fourth embodiments is explained in the fifth embodiment.

Figure 22:
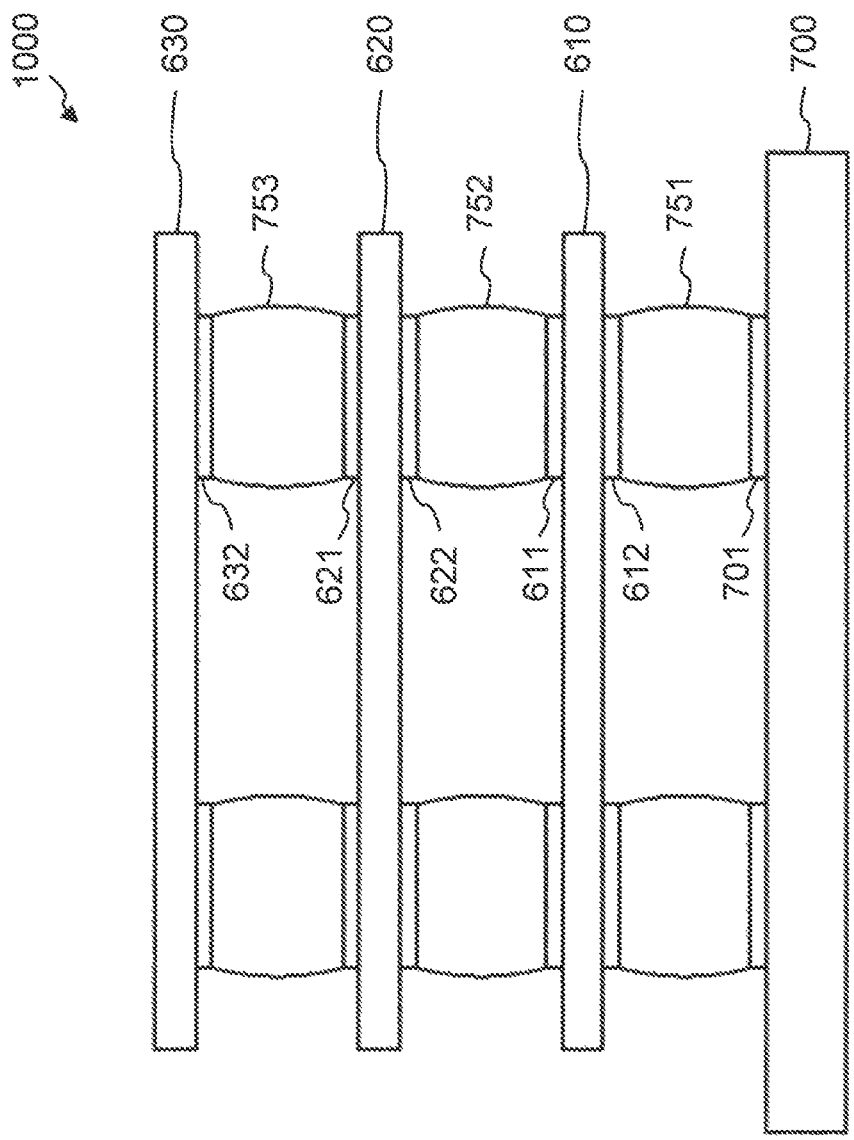
FIG. 22 is a diagram showing a semiconductor device related to a fifth embodiment of the present disclosure.

FIG. 22 is a diagram showing a semiconductor device 1000 related to the fifth embodiment of the present disclosure. The semiconductor device 1000 is stacked with three through-electrode substrates 610, 620, 630 and is connected to an LSI substrate 700. The through-electrode substrate 610 is formed with a semiconductor element such as a DRAM for example and includes connection terminals 611, 612 formed by the wiring layer 104 (not shown in the diagram). One or more of the three through-electrode substrates 610, 620, 630 may be a through-electrode substrate comprised from a substrate formed using glass or sapphire and the like. The connection terminal 612 is connected with a connection terminal 701 of the LSI substrate 700 via a bump 751. The connection terminal 611 is connected with a connection terminal 622 of the through-electrode substrate 620 via a bump 752. A connection terminal 621 of the through-electrode substrate 620 is connected with a connection terminal 632 of the through-electrode substrate 630 via a bump 753. A metal layer such as indium, copper or gold is used for example for the bumps 751, 752, 753.

Furthermore, in the case where through-electrode substrates are stacked, the number of layers is not limited to three and two layers or four layers or more may be stacked. In addition, a connection between a through-electrode substrate and other substrates is not limited to via a bump and eutectic bonding or other bonding technologies may be used. In addition, polyimide or an epoxy resin and the like may be coated and baked to adhere a through-electrode substrate with other substrates.

Figure 23:
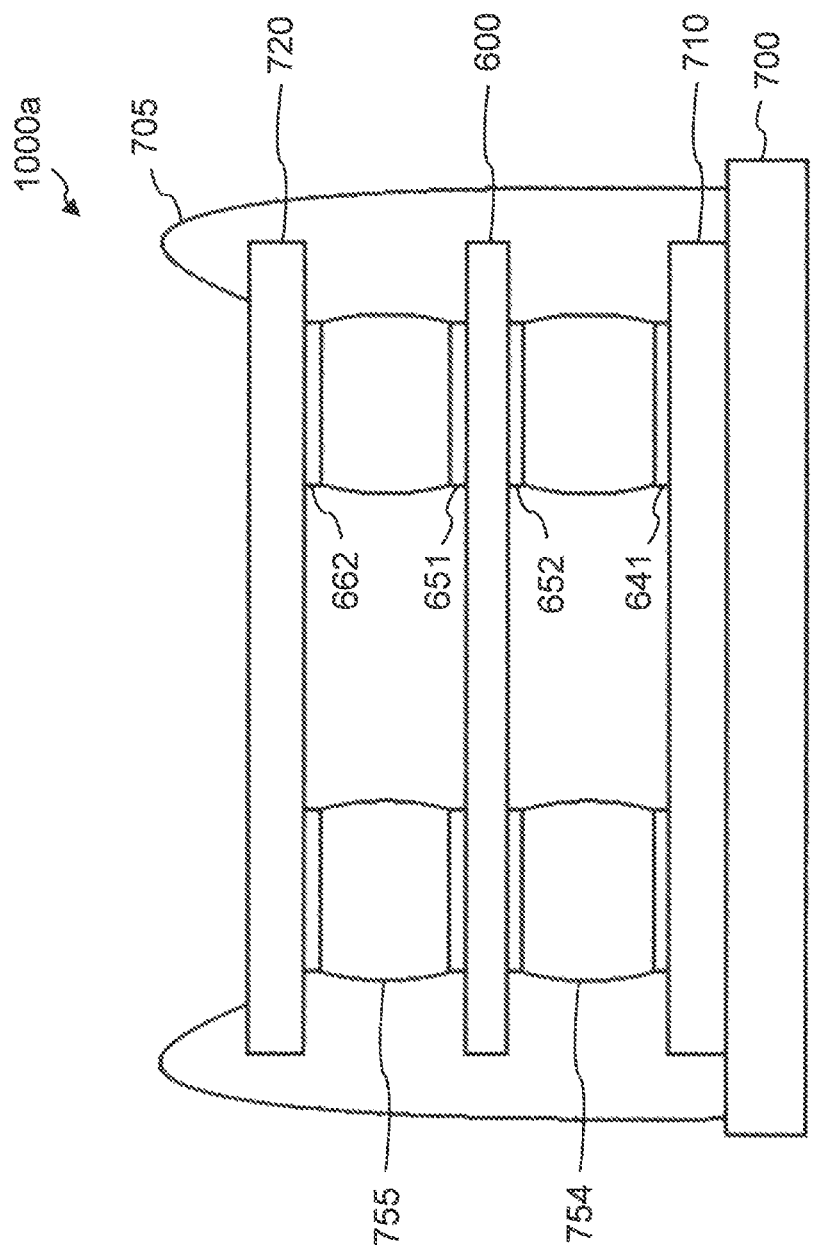
FIG. 23 is a diagram showing another example of a semiconductor device related to the fifth embodiment of the present disclosure.

FIG. 23 is a diagram showing another example of a semiconductor device related to the fifth embodiment of the present disclosure. The semiconductor device 1000a shown in FIG. 23 is stacked with a MEMS device, CPU, semiconductor chips (LSI chip) 710, 720 such as a memory, and a through-electrode substrate 600, and is connected to a LSI substrate 700.

The through-electrode substrate 600 is arranged between the semiconductor chip 710 and semiconductor chip 720, and is connected via bumps 754, 755. The semiconductor chip 710 is mounted above the LSI substrate 700 and the LSI substrate 700 and semiconductor chip 720 are connected via wiring 705. In this example, the through-electrode substrate 600 is used as an interposer for implementing a three-dimensional structure by stacking a plurality of semiconductor chips, and it is possible to manufacture a multi-functional semiconductor device by stacking a plurality of semiconductor chips each with different functions respectively. For example, by making the semiconductor chip 710 a three-axis acceleration sensor and the semiconductor 720 a two-axis magnetic sensor, it is possible to manufacture a semiconductor device in which a five-axis motion sensor is realized in one module.

In the case where a semiconductor chip is a sensor formed by a MEMS device, the results of the sensor are sometimes output by an analog signal. In this case, a low-pass filter or amplifier and the like may be formed in the semiconductor chip 710, 720 or through-electrode substrate 600.

Figure 24:
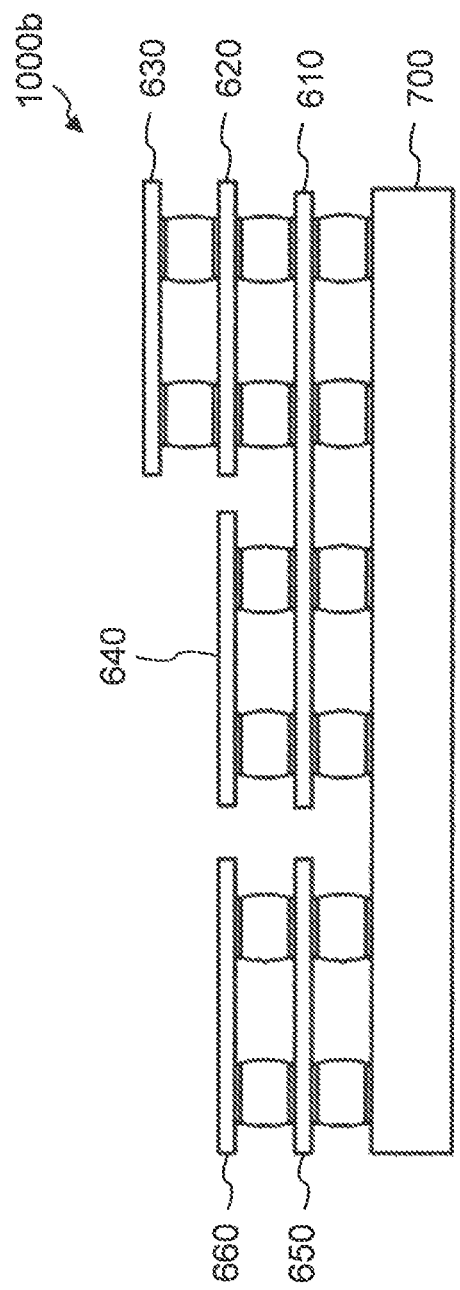
FIG. 24 is a diagram showing yet another example of a semiconductor device related to the fifth embodiment of the present disclosure.

FIG. 24 is a diagram showing another example of a semiconductor device related to the fifth embodiment of the present disclosure. Although the two examples (FIG. 22, FIG. 23) described above implemented a three-dimensional structure, the present example is applied to a combined implementation of a two-dimensional structure and three-dimensional structure. In the semiconductor device 1000b shown in FIG. 24, six through-electrode substrates 610, 620, 630, 640, 650 and 660 are stacked and connected to the LSI substrate 700. However, not only are all the through-electrode substrates arranged by stacking but also arranged along an in-plane direction of the LSI substrate 700. One or more of the six through-electrode substrates 610, 620, 630, 640, 650 and 660 may be a through-electrode substrate comprised from a substrate formed from glass or sapphire and the like.

In the example in FIG. 24, the through-electrode substrates 610, 650 are connected above the LSI substrate 700, the through-electrode substrates 620, 640 are connected above the through-electrode substrate 610, the through-electrode substrate 630 is connected above the through-electrode substrate 620, and the through-electrode substrate 660 is connected above the through-electrode substrate 650. Furthermore, as in the example shown in FIG. 23, even when a through-electrode substrate is used as an interposer for connecting a plurality of semiconductor chips, it is possible to implement a combination of a two-dimensional structure and three-dimensional structure. For example, the through-electrode substrates 630, 640 and 660 may be replaced with a semiconductor chip.

The semiconductor devices 1000, 1000a and 1000b manufactured as described above are mounted in various electrical devices such as mobile terminals (mobile phones, smart phones and note type personal computers etc.), data processing devices (desktop type personal computers, servers, car navigation etc.) and home appliances for example. These electrical devices include a control part formed by a CPU and the like which executes applications and realizes various functions, and a function using an output signal from the semiconductor device 1000 is included in each type of function.

What is claimed is:

1. A through-electrode substrate comprising:
    a base including a first surface and a second surface opposing the first surface; and
    a through-electrode arranged in a through-hole passing through the first surface and second surface of the base;
    wherein the through-electrode passes from the first surface of the base to the second surface of the base and has a first end surface at the first surface side and a second end surface at the second surface side, and
    a periphery edge of one or both of the first end surface and the second end surface is covered by a part of the base.

2. The through-electrode substrate according to claim 1, wherein the base includes a ring shaped convex part along the periphery edge, the ring shaped convex part is arranged above the periphery edge or in an outer side of the periphery edge of the through-electrode.

3. The through-electrode substrate according to claim 1, wherein the base includes glass.

4. The through-electrode substrate according to claim 1, wherein the base includes silicon and an insulation film is arranged in an inner wall surface of the through-electrode.

5. The through-electrode substrate according to claim 1, wherein a component having the same material as the base is arranged on an inner side of one or both of the first end surface of the first surface side and the second end surface of the second surface side having the periphery edge covered by a part of the base.

6. The through-electrode substrate according to claim 1, wherein a plurality of wires is arranged on one or both of the first end surface of the first surface side and the second end surface of the second surface side having the periphery edge covered by a part of the base.

7. A semiconductor device including the through-electrode substrate according to claim 1.

8. A method of manufacturing a through-electrode substrate comprising:
    forming an aperture part in a first surface of a base at a depth not reaching a second surface of the base mutually opposing the first surface;
    forming an electrode by filling the aperture part with a conductive material;
    forming a mask on the second surface of the base, the mask has an aperture corresponding to a part of an inner side region of the electrode and covering a periphery edge of the electrode; and
    etching the second surface of the base in a state arranged with the mask, exposing the part of the inner side region of the electrode, and leaving a part of the base at the periphery edge of the electrode.

9. The method of manufacturing a through-electrode substrate according to claim 8, wherein the mask is formed in a ring shape.

10. The method of manufacturing a through-electrode substrate according to claim 8, wherein at least a part of the etching includes isotropic etching.

11. The method of manufacturing a through-electrode substrate according to claim 8, wherein the mask is removed as the etching proceeds.

* * * * *